United States Patent
Miura et al.

(10) Patent No.: US 11,164,906 B2
(45) Date of Patent: Nov. 2, 2021

(54) MAGNETIC TUNNEL JUNCTION ELEMENT, MAGNETIC MEMORY USING THE SAME, AND MANUFACTURE METHOD OF MAGNETIC TUNNEL JUNCTION ELEMENT

(71) Applicant: HITACHI HIGH-TECH CORPORATION, Tokyo (JP)

(72) Inventors: Katsuya Miura, Tokyo (JP); Hirotaka Hamamura, Tokyo (JP); Yu Zhao, Tokyo (JP); Masaki Yamada, Tokyo (JP); Kiyohiko Sato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/287,589

(22) Filed: Feb. 27, 2019

(65) Prior Publication Data

US 2020/0027920 A1    Jan. 23, 2020

(30) Foreign Application Priority Data

Jul. 19, 2018   (JP) .............................. JP2018-135822

(51) Int. Cl.
*H01L 27/22*    (2006.01)
*H01L 43/12*    (2006.01)
(Continued)

(52) U.S. Cl.
CPC .......... *H01L 27/228* (2013.01); *G11C 11/161* (2013.01); *H01L 43/02* (2013.01);
(Continued)

(58) Field of Classification Search
None
See application file for complete search history.

(56) References Cited

U.S. PATENT DOCUMENTS

2006/0220084 A1   10/2006   Umehara et al.
2012/0217594 A1   8/2012   Kajiyama
(Continued)

FOREIGN PATENT DOCUMENTS

JP    2006261592 A    9/2006
JP    2007305645 A    11/2007
(Continued)

OTHER PUBLICATIONS

Office Action dated Aug. 26, 2020 in Taiwanese Application No. 108100618.
(Continued)

*Primary Examiner* — Grant S Withers
(74) *Attorney, Agent, or Firm* — Miles & Stockbridge, P.C.

(57) ABSTRACT

To provide a magnetic tunnel junction (MTJ) element that is adapted to suppress the degradation of magnetic properties of a magnetic tunnel junction layer due to plasma CVD layer formation and adapted for miniaturization. The MTJ element includes a magnetic tunnel junction layer (101, 102, 103) and a plurality of passivation layers formed on a side wall of the magnetic tunnel junction layer. The plurality of passivation layers are SiN layers formed under different plasma CVD layer forming conditions and include a first passivation layer 109 formed in direct contact with the magnetic tunnel junction layer. A hydrogen ion density or hydrogen ion energy of a layer forming condition for the first passivation layer is lower than a hydrogen ion density or hydrogen ion energy of a layer forming condition for the other of the plural passivation layers. The other passivation layers include a passivation layer, a nitrogen density of which is higher than a nitrogen density of the first passivation layer.

17 Claims, 17 Drawing Sheets

(51) Int. Cl.
  *G11C 11/16*  (2006.01)
  *H01L 43/08*  (2006.01)
  *H01L 43/02*  (2006.01)
  *H01L 43/10*  (2006.01)

(52) U.S. Cl.
  CPC ............ *H01L 43/08* (2013.01); *H01L 43/10* (2013.01); *H01L 43/12* (2013.01)

(56) References Cited

U.S. PATENT DOCUMENTS

| | | |
|---|---|---|
| 2012/0326252 A1 | 12/2012 | Yamakawa et al. |
| 2013/0094284 A1 | 4/2013 | Ohno et al. |
| 2015/0069556 A1 | 3/2015 | Yamakawa et al. |
| 2016/0197268 A1 | 7/2016 | Yakabe et al. |
| 2019/0165259 A1* | 5/2019 | Liao ........................ H01L 43/08 |

FOREIGN PATENT DOCUMENTS

| | | | |
|---|---|---|---|
| JP | 2011258596 A | 12/2011 |
| JP | 2012182219 A | 9/2012 |
| JP | 2012227339 A | 11/2012 |
| JP | 2013008868 A | 1/2013 |
| JP | 2015179694 A | 10/2015 |

OTHER PUBLICATIONS

Office Action dated Mar. 17, 2021 in corresponding Korean Application No. 10-2018-0162793.
Office Action dated Jun. 2, 2020 in corresponding Korean Application No. 10-2018-0162793.

\* cited by examiner

MAGNETIC TUNNEL JUNCTION ELEMENT, MAGNETIC MEMORY USING THE SAME, AND MANUFACTURE METHOD OF MAGNETIC TUNNEL JUNCTION ELEMENT

CROSS-REFERENCE TO RELATED APPLICATION

This application claims priority to Japanese Patent Application No. 2018-135822 filed on Jul. 19, 2018, the entire contents of which are incorporated by reference herein.

BACKGROUND

The present invention relates to a magnetic memory (MRAM: Magnetoresistive Random Access Memory) and a magnetic tunnel junction (MTJ: Magnetic Tunnel Junction) element constituting a memory cell. More particularly, the invention relates to a passivation layer of magnetic tunnel junction.

The MRAM is a variable resistance nonvolatile memory including an MTJ element as a component. A basic structure of the MTJ element is a three-layer structure where a first ferromagnetic layer, a first tunnel barrier, and a second ferromagnetic layer are deposited.

The MTJ element is normally configured such that either one of the first ferromagnetic layer and the second ferromagnetic layer works as a recording layer the magnetization of which is variable while the other works as a reference layer the magnetization of which is less reversible. The MTJ element has a property that the resistance thereof varies according to a relative angle of magnetizations between the first ferromagnetic layer and the second ferromagnetic layer. When the magnetization of the first ferromagnetic layer and the magnetization of the second ferromagnetic layer are parallel to each other (parallel state), the MTJ element exhibits the minimum resistance. When the magnetization of the first ferromagnetic layer and the magnetization of the second ferromagnetic layer are antiparallel to each other (antiparallel state), the MTJ element exhibits the maximum resistance. This resistance change ratio is referred to as Tunnel Magnetic Resistance (TMR) ratio.

In the MRAM, the two resistive states are related to bit information pieces "0" and "1". Since the MTJ element maintains the magnetization direction if the power supply is shut off, the MTJ element can retain the bit information, having non-volatility. A system where information is written by inverting the magnetization of the recording layer by means of spin-transfer torque generated by applying a current to the MTJ element is becoming predominant. In this case, the bit information pieces "0" and "1" to be written can be differentiated by changing the direction of current applied to the MTJ element.

Next, description is made on the magnetization direction of the MTJ element. As for the magnetization direction of the MTJ element, it has been a common practice to apply magnetic materials magnetized in a horizontal direction with respect to the layer plane to the first ferromagnetic layer and the second ferromagnetic layer. This is for applying a material having a high TMR ratio to the first ferromagnetic layer and the second ferromagnetic layer. Such materials have properties to be magnetized in the horizontal direction with respect to the layer plane. However, the MTJ element magnetized perpendicularly to the layer plane is more suitable for miniaturization and is apt to maintain nonvolatility. In this connection, material technologies have been developed to produce materials which exhibit large resistance changes and perpendicular magnetizations. Accordingly, the MTJ element can maintain the perpendicular magnetization direction with respect to the layer plane while maintaining the high TMR ratio. Japanese Unexamined Patent Application Publication No. 2011-258596, for example, cites an example of achieving a high TMR ratio and perpendicular magnetization by applying CoFeB to the first ferromagnetic layer and the second ferromagnetic layer and applying MgO to the first tunnel barrier.

Japanese Unexamined Patent Application Publication No. 2012-182219 and Japanese Unexamined Patent Application Publication No. 2013-8868 teach that the MTJ element can be improved in coercive force properties by disposing a stress layer at the MTJ element having such a perpendicular magnetization layer. This is because perpendicularly stretching the MTJ element with respect to the layer plane of the perpendicular magnetization layer increases magnetic shape anisotropy in the perpendicular direction. Specifically, Japanese Unexamined Patent Application Publication No. 2012-182219 discloses an element structure where a stress layer such as to apply a tensile stress to a substrate is disposed on an upper side of the MTJ element while a stress layer such as to apply a compressive stress to the substrate is disposed on a lower side of the MTJ element. Further, Japanese Unexamined Patent Application Publication No. 2013-8868 discloses an element structure where a sidewall layer applying a tensile stress to the MTJ element for stretching the MTJ element perpendicularly along the magnetization direction thereof is formed on a side wall of the MTJ element.

Japanese Unexamined Patent Application Publication No. 2015-179694 discloses an MTJ element provided with a plurality of passivation layers. However, Japanese Unexamined Patent Application Publication No. 2015-179694 is based on the assumption that the passivation layers are formed by sputtering method. Japanese Unexamined Patent Application Publication No. 2015-179694 substantially differs from this application in the method of forming the passivation layers, and properties, effects and the like of the passivation layers.

SUMMARY

The inventors have found that there is a case where the perpendicular magnetization of the MTJ element becomes instable due to the application of a stress to the MTJ element such as to stretch the MTJ element in the perpendicular direction with respect to the layer plane of the perpendicular magnetization layer.

The reason that the magnetization direction of a ferromagnetic layer material containing at least one 3d transition metal (e.g., CoFeB) is perpendicular to the layer plane is because interfacial magnetic anisotropy induced at an interface between the ferromagnetic layer and the tunnel barrier becomes dominant with decreasing the thickness of the ferromagnetic layer. More specifically, the interfacial magnetic anisotropy at the interface between a CoFeB layer and an MgO layer has an effect to align magnetization perpendicularly to the layer plane. In contrast, the intrinsic magnetic anisotropy of the CoFeB layer tends to align the magnetization in an in-plane direction. The interfacial magnetic anisotropy must overcome the magnetic anisotropy of the CoFeB layer in order to achieve the perpendicular magnetization. In the case of the CoFeB layer, if the thickness thereof is sufficiently reduced to 2 nm or less, the interfacial magnetic anisotropy becomes predominant over the magnetic anisotropy of the CoFeB layer. Hence, the perpendicular magnetization is achieved.

A mechanism responsible for the generation of the interfacial magnetic anisotropy at the interface between the CoFeB layer and the MgO layer is that Fe in the CoFeB combines with O in MgO. Therefore, hybridization between Fe (3d transition metal) and O must be dully ensured to achieve the perpendicular magnetic anisotropy.

The cause for the perpendicular magnetization of the MTJ element destabilized by applying the perpendicular tensile stress to the layer plane of the perpendicular magnetization layer thereof is that the Fe—O hybridization serving a significant role in the generation of the interfacial magnetic anisotropy is impaired by interfacial lattice mismatch caused by the stress application. Even though the configuration increased in the magnetic shape anisotropy is obtained by applying stress, the MTJ element is rather degraded in its properties due to the decreased interfacial magnetic anisotropy.

When attention is paid to the interfacial magnetic anisotropy, a passivation layer forming step by plasma CVD in a manufacturing process of the MTJ element involves a fear that the interfacial magnetic anisotropy of the CoFeB layer and MgO layer is reduced due to an oxidation-reduction reaction caused by plasma. An advantage of forming the passivation layer by plasma CVD consists in the formation of a dense layer. It is known that the interfacial magnetic anisotropy is maximized when a composition ratio of Fe to O at the interface is 1:1. If an oxidation or reduction reaction occurs in the passivation layer forming step by plasma CVD, the composition ratio of O to Fe changes, acting to reduce the interfacial magnetic anisotropy.

A brief description of a typical embodiment of the invention disclosed in the present application is as follows.

An MTJ element according to one aspect of the invention includes: a magnetic tunnel junction layer and a plurality of passivation layers formed on a side wall of the magnetic tunnel junction layer. The plurality of passivation layers are SiN layers which are formed under different layer forming conditions and include a first passivation layer formed in direct contact with the magnetic tunnel junction layer. A hydrogen ion density or hydrogen ion energy of the layer forming condition for the first passivation layer is lower than a hydrogen ion density or hydrogen ion energy of a layer forming condition for the other of the plural passivation layers. The other passivation layer includes a passivation layer where a nitrogen density of which is higher than a nitrogen density of the first passivation layer.

It is an object of the invention to provide an MTJ element which is adapted to suppress the degradation of magnetic properties of the magnetic tunnel junction layer due to layer formation by plasma CVD and adapted for miniaturization, and MRAM using the same.

Other objects and novel features of the invention will become apparent from the following description of the invention and the accompanying drawings.

DETAILED DESCRIPTION

Figure 1:
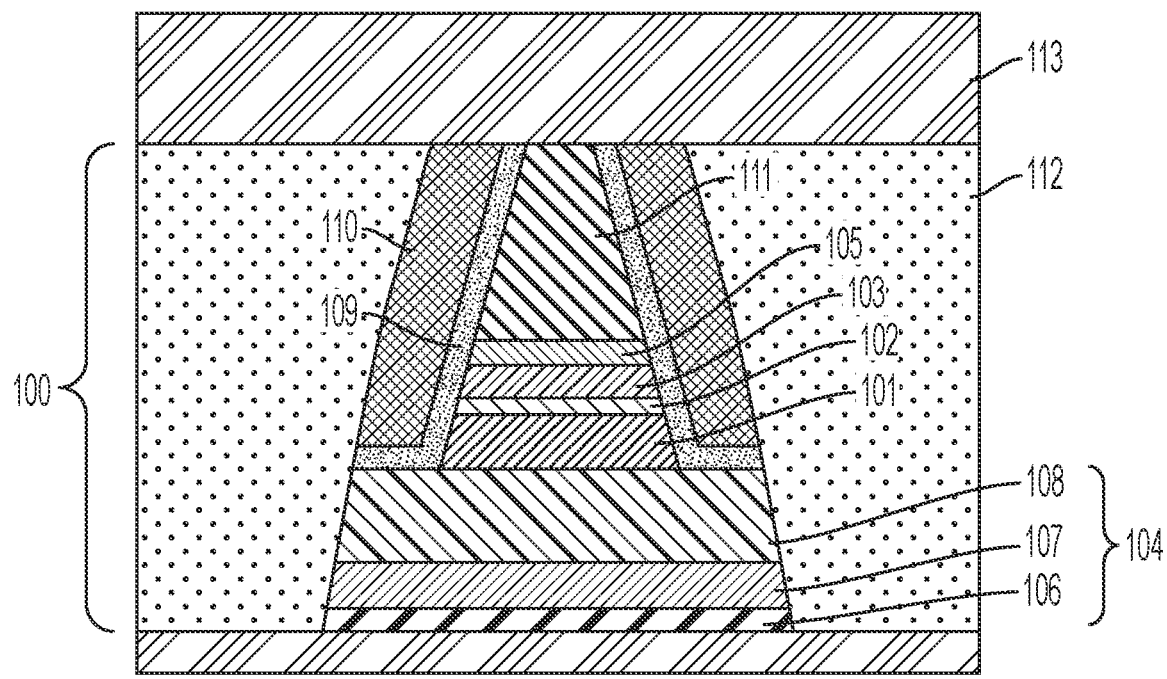
FIG. 1 is a sectional view of a perpendicular MTJ element according to a first embodiment hereof.

If in the description of the following embodiments, the description need be divided into plural sections or individual embodiments for reasons of expediency, each of the plural sections or each of the embodiments is described discretely. Unless otherwise particularly stated, however, these sections or embodiments are not unrelated to each other but are in such a relation that one section or embodiment is a modification, detail, supplementary explanation or the like of a part or the whole of the other section or embodiment.

If the number or the like (inclusive of number of pieces, numerical value, amount, range and the like) of an element is cited, the invention is not limited to the particular number but may also be more than or less than the particular number unless otherwise particularly stated or unless the invention is obviously limited to a particular number.

In the following embodiments, it goes without saying that the components of the invention (inclusive of element step and the like) are not necessarily deemed as essential unless otherwise particularly stated and unless otherwise obviously deemed as essential in principle.

Likewise, in the following embodiments, when the configuration, positional relation and the like of the components are referred to, the configurations and the like are defined to include those which are substantially close to or analogous to the configurations and the like of the components unless otherwise particularly stated or obviously deemed as different in principle. The same applies to the numerical values and the range of the components and the like of the embodiments.

Throughout the Figures illustrating the embodiments, equal or similar reference numerals are assigned to equal or similar components, which are explained only once in most cases to avoid repetitions. For clarity of illustration, even a plan view may sometimes be cross-hatched or even a sectional view may not be cross-hatched sometimes.

First Embodiment

A structure of an MTJ element according to a first embodiment hereof is described. FIG. 1 is a sectional view of the MTJ element. An MTJ element 100 is based on a magnetic tunnel junction layer of a three-layer structure which includes a first ferromagnetic layer 101, a first tunnel barrier 102 and a second ferromagnetic layer 103 which are deposited on top of each other in this order. The MTJ element 100 further includes: a bottom electrode 104 in contact with an interface on the opposite side of the first ferromagnetic layer from the first tunnel barrier 102; and a cap layer 105 in contact with an interface on the opposite side of the second ferromagnetic layer from the first tunnel barrier 102. According to the example shown in FIG. 1, the bottom electrode 104 has a three-layer structure which includes a first nonmagnetic layer 106, a second nonmagnetic layer 107 and a third nonmagnetic layer 108. However, the bottom electrode 104 need not always have the three-layer structure if the MTJ element is not decreased in the TMR ratio or the magnetic anisotropy. While the cap layer 105 consists of one layer, the cap layer need not consist of one layer if the MTJ element is not decreased in the magnetic anisotropy. Further, the MTJ element may have a bottom pin structure where the first ferromagnetic layer 101 defines a reference layer, and the second ferromagnetic layer 103 defines a recording layer, or have a top pin structure where the first ferromagnetic layer 101 defines the recording layer, and the second ferromagnetic layer 103 defines the reference layer.

The first ferromagnetic layer 101 and the second ferromagnetic layer 103 employ CoFeB as a material thereof, while the first tunnel barrier 102 employs MgO as a material thereof. This is for achieving the perpendicular magnetization by utilizing the interfacial magnetic anisotropy at an interface between the CoFeB layer and the MgO layer. The first ferromagnetic layer 101, the second ferromagnetic layer 103 and the first tunnel barrier 102 may employ any other material combination as materials of the magnetic tunnel junction layer so long as such a material combination can develop the interfacial magnetic anisotropy and achieve the perpendicular magnetization.

In the bottom electrode 104, the first nonmagnetic layer 106 and the third nonmagnetic layer 108 employ Ta as a material thereof, while the second nonmagnetic layer 107 employs Ru as a material thereof. The bottom electrode 104 can be reduced in surface roughness by adopting such a laminate structure. If the bottom electrode 104 has large surface roughness, the lattice mismatch is induced at the interface between the ferromagnetic layer and the tunnel barrier, resulting in the development of lowered interfacial magnetic anisotropy. The decrease in the TMR ratio and the magnetic anisotropy of the MTJ element 100 can be avoided by minimizing the surface roughness. The bottom electrode may employ any other material combination or any other laminate structure so long as such a material combination or the like can reduce the surface roughness of the bottom electrode.

The cap layer 105 employs Ru as a material thereof. The use of Ru may sometimes result in the decrease of the magnetic anisotropy of the recording layer 103 and hence, Ta may be used in place thereof. In a case where the cap layer employs Ta as the material thereof, however, an area of a mixture of CoFeB and Ta, namely a magnetic dead layer may be formed at a boundary between the second ferromagnetic layer 103 and the cap layer 105. This means that the second ferromagnetic layer 103 is decreased in effective thickness. It is therefore necessary to decide the thickness of the second ferromagnetic layer 103 in consideration of the thickness of the dead layer when the cap layer 105 employs Ta as the material thereof. The consideration of the thickness of the dead layer eliminates a fear that Ta is the cause of the decreased magnetic anisotropy of the second ferromagnetic layer 103. As described above, the cap layer 105 may employ any other material so long as such a material does not decrease the magnetic anisotropy of the second ferromagnetic layer 103.

According to the first embodiment, as shown in FIG. 1, the MTJ element 100 includes a first passivation layer 109 so formed as to cover a side wall thereof, and a second passivation layer 110 so formed as to cover the first passivation layer 109. The first passivation layer 109 of the first embodiment is formed by plasma CVD. In a stage before the layer formation by plasma CVD, the MTJ element 100 is processed into a pillar shape. FIG. 1 illustrates the MTJ element having a configuration the diameter of which is progressively reduced toward the top. Such a configuration is obtained by etching a laminate layer and is also described as "pillar configuration" herein. If the MTJ element is exposed to the atmosphere before the formation of the passivation layers, the MTJ element 100 is degraded in the magnetic properties. After processed into the pillar configuration, therefore, the MTJ element 100 is subjected to passivation layer formation by plasma CVD without being exposed to the atmosphere.

During the formation of the first passivation layer 109, the side wall of the MTJ element 100 is exposed. Therefore, oxidation-reduction reaction by plasma occurs on the side wall of the MTJ element 100 during the formation of the passivation layer by plasma CVD. Accordingly, the MTJ element is decreased in the interfacial magnetic anisotropy at an interface between the CoFeB layer and the MgO layer and hence, is degraded in the magnetic properties. Therefore, a layer forming condition for the first passivation layer 109 is defined such that plasma has low density or low energy. As a result, the frequency of the oxidation reaction or reduction reaction decreases during the passivation layer formation by plasma CVD so that the reduction of the interfacial magnetic anisotropy can be suppressed.

Subsequently, the second passivation layer 110 is formed under a condition that a total stress of the first passivation layer 109 and the second passivation layer 110 approaches zero. As a result, the lattice mismatch at the interface between the CoFeB layer and the MgO layer is eliminated so that the reduction of the interfacial magnetic anisotropy can be further suppressed.

Both the first passivation layer 109 and the second passivation layer 110 of the first embodiment employ SiN deposited by plasma CVD as the material thereof. In a case where the SiN layer is formed by plasma CVD, the reduction reaction is induced because of the use of H gas. When the first passivation layer 109 is formed, a bias voltage of 50V is applied for Plasma CVD, and the density and energy level of hydrogen ions are controlled to decrease. As a result, the reduction reaction is suppressed so that the interfacial magnetic anisotropy is not decreased. A stress (stress in compression) of the first passivation layer 109 formed under this condition is applied in a direction to compress the MTJ element horizontally inwardly with respect to the layer plane. The stress has a magnitude of 50 MPa.

Since the first passivation layer 109 is formed at the compressive stress of 50 MPa, the second passivation layer 110 is formed under a condition that a stress (stress in tension) of 50 MPa is applied to the MTJ element 100 in a direction to stretch the MTJ element horizontally outwardly with respect to the layer plane. To apply a tensile stress to SiN, a ratio of N gas used for forming the layer by plasma CVD may be increased. Therefore, the first passivation layer 109 and the second passivation layer 110 have different N contents. The SiN forming the second passivation layer has a higher N content than the SiN forming the first passivation layer 109. It is noted that the stress directions and the stress values of the first passivation layer 109 and the second passivation layer are examples to explain that the total stress is adjusted to approach zero. The passivation layers may have values other than the above.

The bottom electrode 104 is etched for element isolation by using the second passivation layer as a mask and then, an interlayer insulator 112 is formed. Further, the interlayer insulator 112 is removed with planarization by CMP (Chemical Mechanical Polishing) till the exposure of a hard mask layer 111. Subsequently, a top electrode 113 is so formed as to be electrically connected to an upper end of the hard mask layer 111.

Figure 2A:
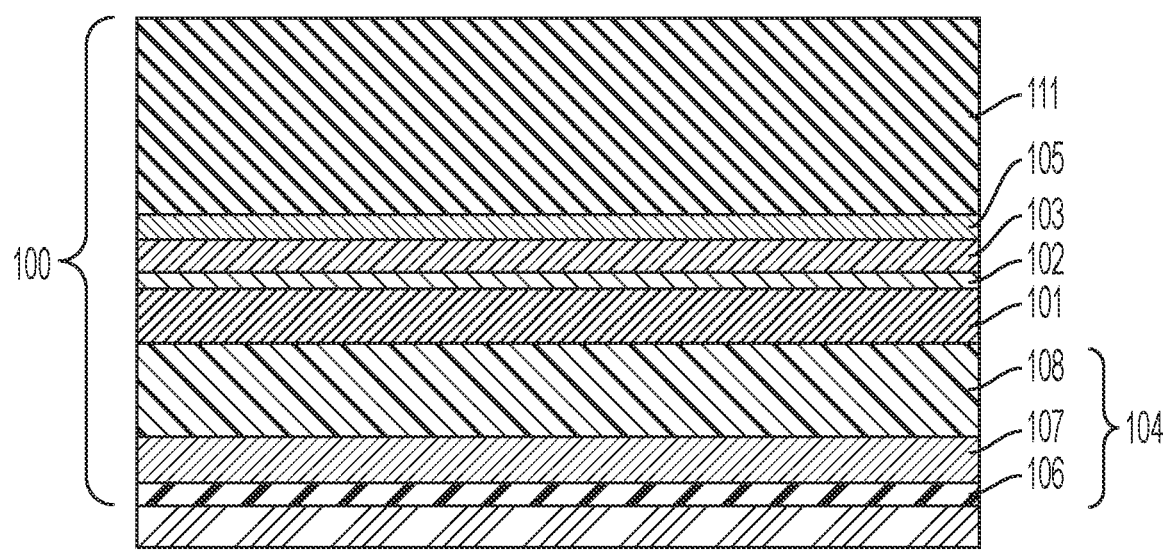
FIG. 2A is a diagram showing a step of a manufacturing process of the perpendicular MTJ element according to the first embodiment hereof.

FIG. 2A to FIG. 2G show a manufacturing flow of the MTJ element of FIG. 1. FIG. 2A shows a layer configuration of the laminate layer constituting the MJT element 100. In MRAM, the MTJ elements are often formed between wirings in a wiring process of a semiconductor wafer processing. In the first embodiment, as well, the MTJ elements are formed between wires. In a wire layer, the bottom electrode 104 (the first nonmagnetic layer 106, the second nonmagnetic layer 107 and the third nonmagnetic layer 108), the first ferromagnetic layer 101, the first tunnel barrier 102, the second ferromagnetic layer 103, the cap layer 105 and the hard mask layer 111 are laminated on top of each other in this order. As for the thicknesses of the layers, the first ferromagnetic layer 101 has a thickness of 1.0 nm; the first tunnel barrier 102 has a thickness of 1.0 nm; the second ferromagnetic layer 103 has a thickness of 1.6 nm; the first nonmagnetic layer 106 has a thickness of 5 nm; the second nonmagnetic layer 107 has a thickness of 10 nm; and the third nonmagnetic layer 108 has a thickness of 20 nm.

Figure 2B:
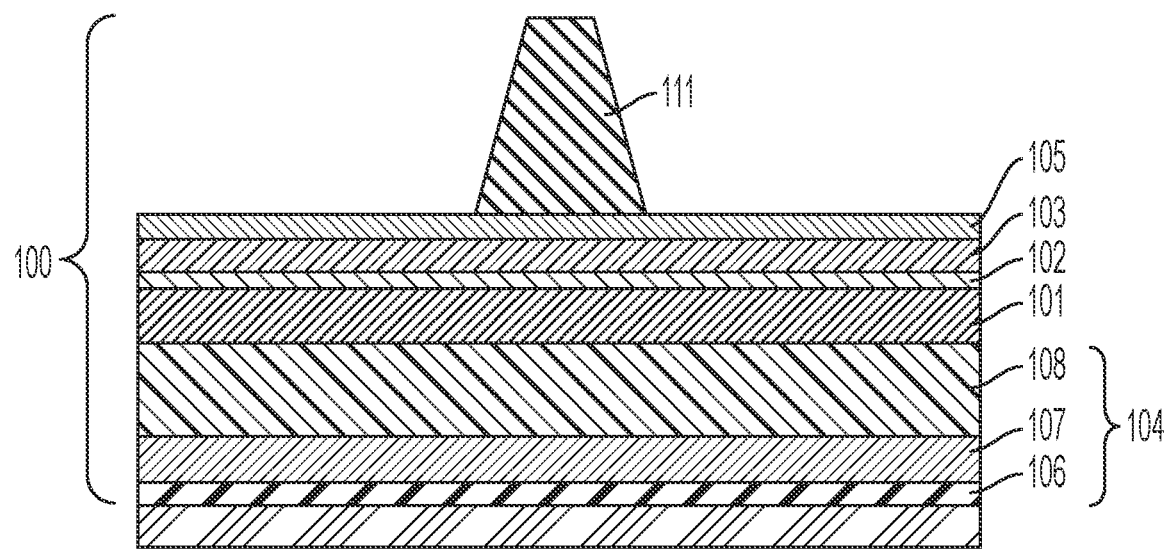
FIG. 2B is a diagram showing a step of the manufacturing process of the perpendicular MTJ element according to the first embodiment hereof.

FIG. 2B shows a step of processing the hard mask layer 111. The hard mask layer 111 can employ Ta as the material thereof. In the layer forming step, the hard mask layer is formed in a thickness of 150 nm. A resist layer is overlaid on the hard mask layer 111. The resist layer is so patterned as to allow the MTJ element to be formed at a desired position. The resist pattern is transferred to the hard mask layer 111.

Figure 2C:
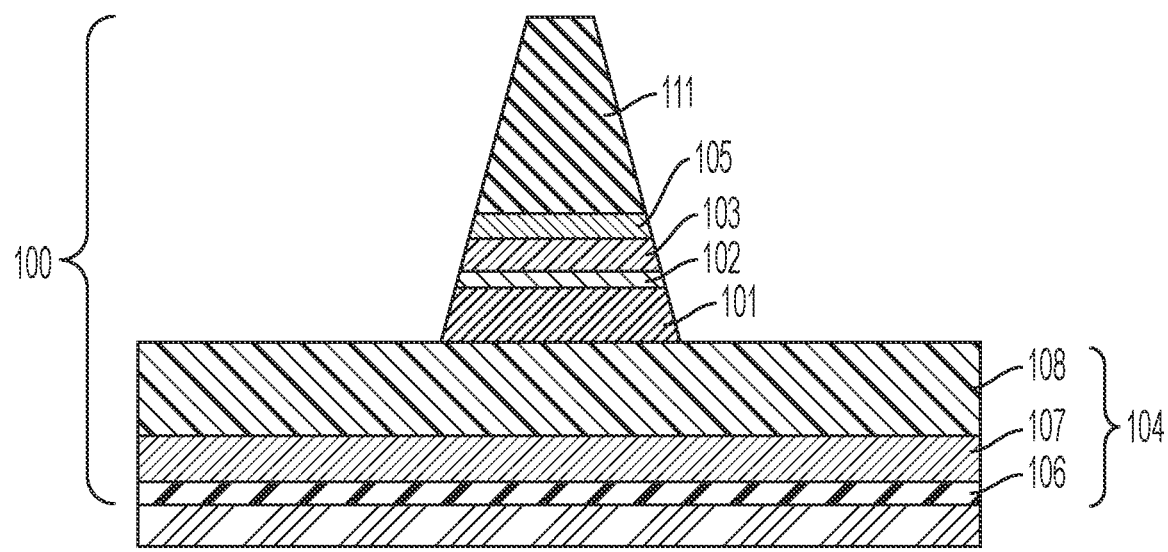
FIG. 2C is a diagram showing a step of the manufacturing process of the perpendicular MTJ element according to the first embodiment hereof.

FIG. 2C shows a step of etching the first ferromagnetic layer 101, the first tunnel barrier 102, the second ferromagnetic layer 103 and the cap layer 105 by using the hard mask layer 111 patterned in the step of FIG. 2B. An etching endpoint is defined as the time point when the third nonmagnetic layer 108 is partly removed by etching from the surface thereof after the etching of the first ferromagnetic layer 101 has been completed.

Figure 2D:
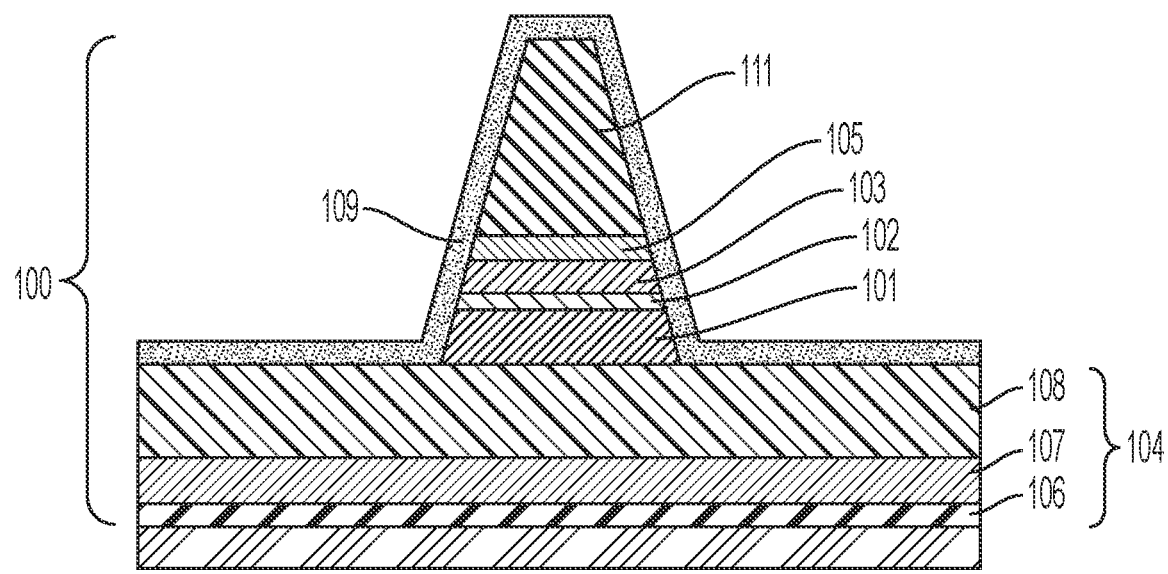
FIG. 2D is a diagram showing a step of the manufacturing process of the perpendicular MTJ element according to the first embodiment hereof.

Subsequently, the first passivation layer 109 is formed by plasma CVD without exposure to the atmosphere. This step is shown in FIG. 2D. The first passivation layer 109 employs an SiN layer having a thickness of 10 nm. This step adopts a low ion density and low ion energy condition such as to suppress the reduction reaction caused by hydrogen ions, as described above. The first passivation layer 109 formed under this condition exhibits a compressive stress of 50 MPa.

Figure 2E:
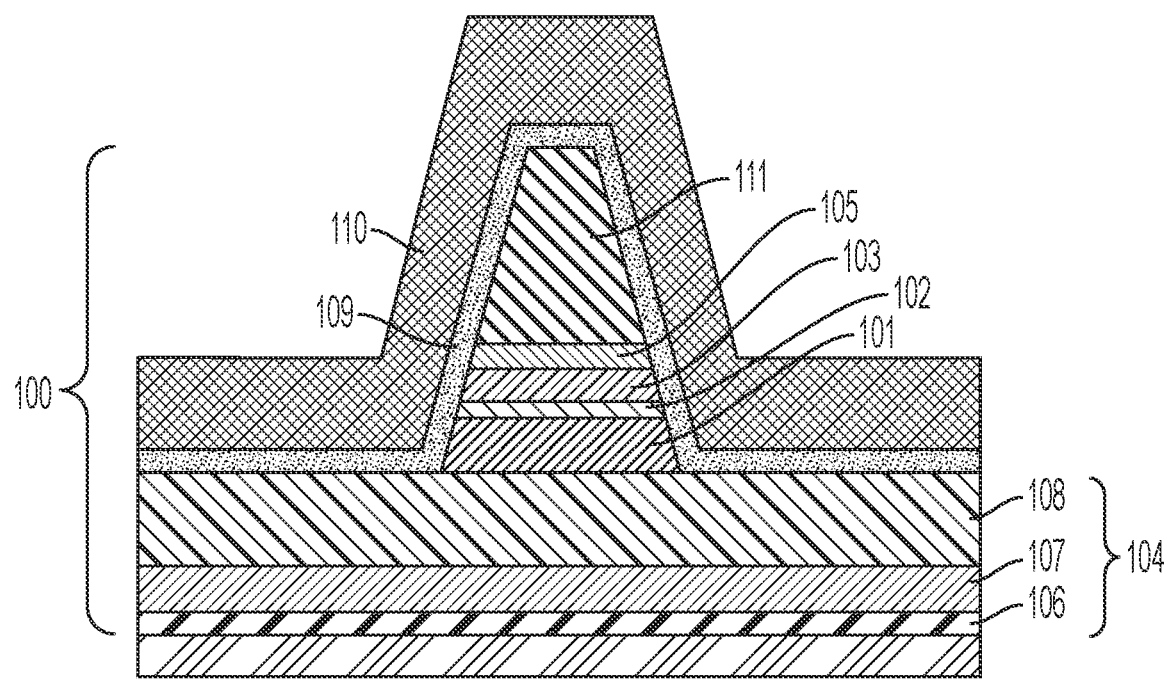
FIG. 2E is a diagram showing a step of the manufacturing process of the perpendicular MTJ element according to the first embodiment hereof.

FIG. 2E shows a step of forming the second passivation layer 110. The second passivation layer 110 employs an SiN layer having a thickness of 20 nm. The second passivation layer 110 needs to exhibit a tensile stress of 50 MPa. To impart the tensile stress, the layer needs to be formed under a condition that a density of SiN is 3 g/cm$^3$ or more and N—H bond amount is $5 \times 10^{21}$ atms/cm$^3$ or more. However, the layer formation is not limited to this condition so long as a desired tensile stress can be imparted. The implementation of such a condition at least requires the increase in the flow rate of N gas during the layer formation by plasma CVD. As a result, the N content of the second passivation layer 110 is higher than that of the first passivation layer 109.

Figure 2F:
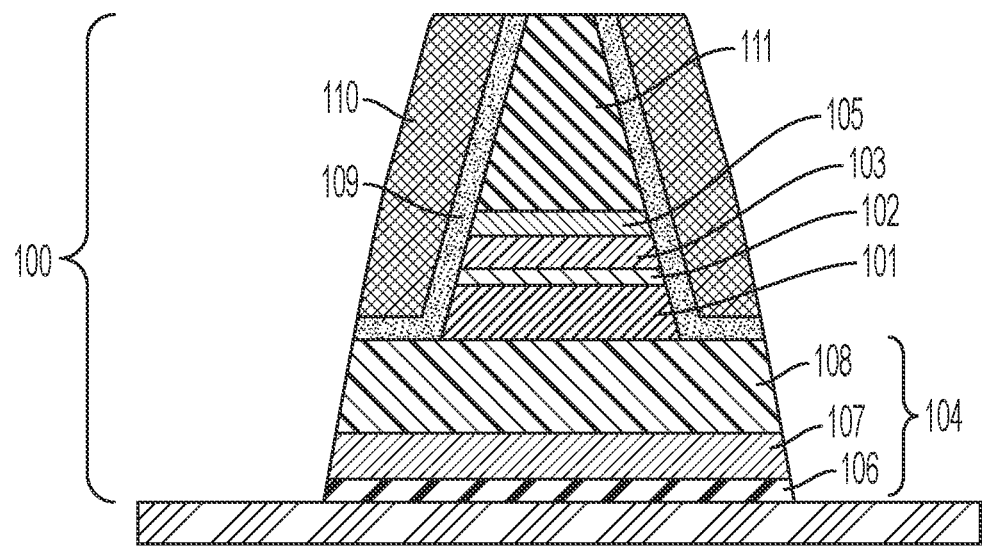
FIG. 2F is a diagram showing a step of the manufacturing process of the perpendicular MTJ element according to the first embodiment hereof.
Figure 2G:
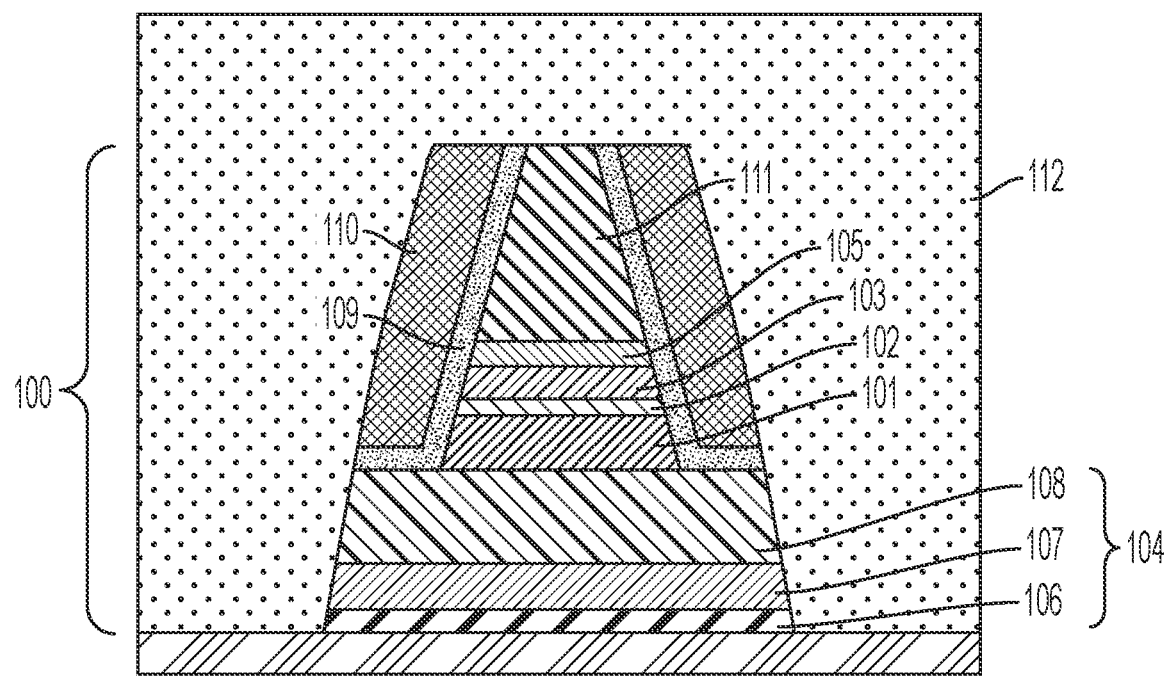
FIG. 2G is a diagram showing a step of the manufacturing process of the perpendicular MTJ element according to the first embodiment hereof.

FIG. 2F shows a step of etching the bottom electrode 104 by using the second passivation layer 110 as a mask. A subsequent step of forming the interlayer insulator 112 is shown in FIG. 2G.

The MTJ element 100 manufactured in this manner is prevented by the first passivation layer 109 from being decreased in the interfacial magnetic anisotropy due to the reduction reaction at the interface between the first ferromagnetic layer 101 and the first tunnel barrier 102, and between the second ferromagnetic layer 103 and the first tunnel barrier 102. Further, the MTJ element is also prevented from being decreased in the interfacial magnetic anisotropy due to the lattice mismatch because the total stress of the first passivation layer 109 and the second passivation layer 110 is controlled to be in vicinity of zero by the second passivation layer 110. As described above, the MJT element featuring stable perpendicular magnetization with respect to the layer plane can be obtained by imparting an oxidation-reduction reaction suppression function to the first passivation layer 109 and imparting a stress adjustment function to the second passivation layer 110.

Second Embodiment

In the first embodiment, the passivation layer is formed in the two-layer structure and the different functions of oxidation-reduction reaction suppression and stress adjustment are imparted to the respective layers. According to a second embodiment, an MTJ element features a structure further enhanced in reliability by forming the passivation layer in a three-layer structure and imparting three different functions of oxidation-reduction reaction suppression, stress adjustment and moisture resistance enhancement to the respective layers.

Figure 3:
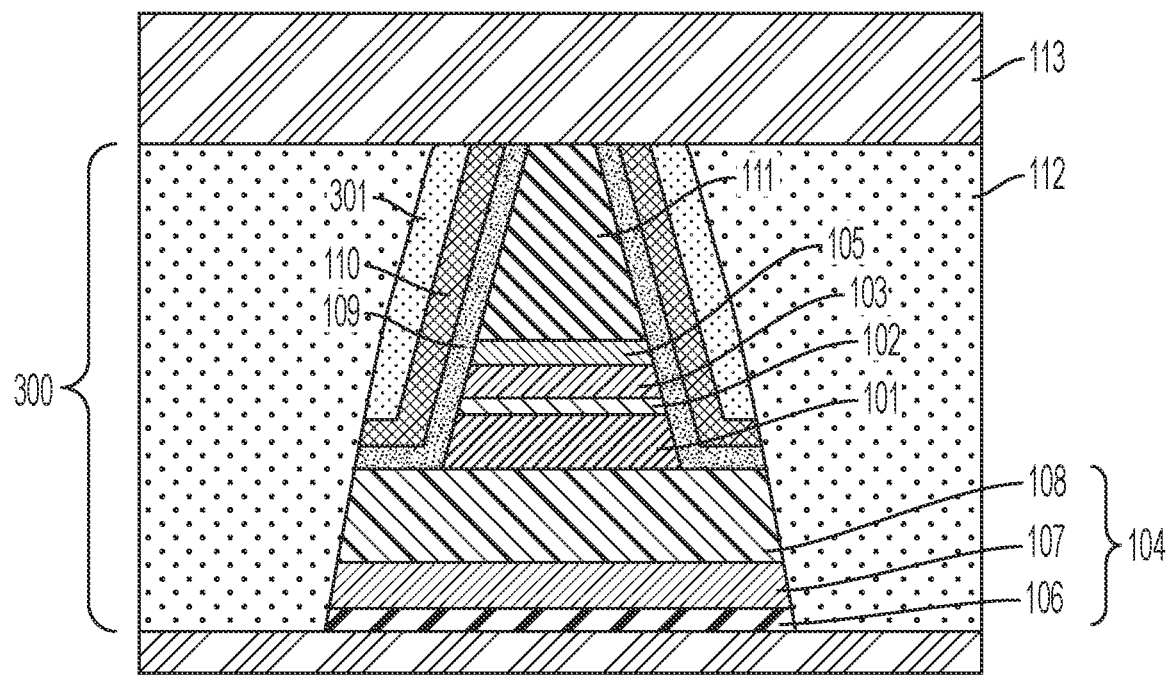
FIG. 3 is a sectional view of a perpendicular MTJ element according to a second embodiment hereof.

A structure of the MTJ element according to the second embodiment is described with reference to FIG. 3. FIG. 3 is a sectional view of the MTJ element of the second embodiment. An MTJ element 300 according to the second embodiment has the same laminate structure as that of the first embodiment. While the MTJ element has the bottom pin structure where the first ferromagnetic layer 101 defines the reference layer and the second ferromagnetic layer 103 defines the recording layer, the MTJ may also have the top pin structure where the first ferromagnetic layer 101 defines the recording layer and the second ferromagnetic layer 103 defines the reference layer. The same materials as those of the first embodiment are used for the respective layers.

As shown in FIG. 3, the MTJ element 300 of the second embodiment includes: the first passivation layer 109 so formed as to cover the side wall thereof; the second passivation layer 110 so formed as to cover the first passivation layer 109; and a third passivation layer 301 so formed as to cover the second passivation layer 110.

The first passivation layer 109 of the second embodiment serves the same role as that in the first embodiment. The first passivation layer 109 is formed under the condition that the plasma has the low density and low energy so that the frequency of the oxidation reaction or the reduction reaction by plasma CVD decreases during the formation of the passivation layer. Thus, the reduction of the interfacial magnetic anisotropy is suppressed.

The second passivation layer 110 is formed under the condition that the total stress of the first passivation layer 109, the second passivation layer 110, and the third passivation layer 110 approaches zero. As a result, the lattice mismatch at the interface between the CoFeB layer and the MgO layer is eliminated so that the reduction of the interfacial magnetic anisotropy is further suppressed.

The third passivation layer 301 is likely to be exposed to the atmosphere and hence, is formed under a condition to impart an excellent moisture resistance to the layer. The denser the layer, the more excellent in moisture resistance is the layer. The layer excellent in moisture resistance can be obtained by adjusting a gas quantity so as to provide an Si/N ratio of 1:1 and increasing the density and energy of plasma. Therefore, the N content of the third passivation layer 301 is lower than that of the second passivation layer 110. As compared with the MTJ element 100 of the first embodiment, the MTJ element 300 of the second embodiment can be improved in moisture resistance and can achieve higher reliability.

According to the second embodiment, all the first passivation layer 109, the second passivation layer 110 and the third passivation layer 301 employ SiN processed by plasma CVD as the material thereof. When the first passivation layer 109 is formed, a bias voltage of 50V is applied for plasma CVD and the density and energy of hydrogen ions are lowered. As a result, the reduction reaction is suppressed so that the interfacial magnetic anisotropy is not decreased. The first passivation layer 109 formed under this condition exhibits compressive stress, the magnitude of which is 50 MPa.

Next, the second passivation layer 110 is formed. The first passivation layer 109 is formed at the compressive stress of 50 MPa. As will be described hereinlater, the third passivation layer 301 is formed at a compressive stress of 140 MPa. Therefore, the second passivation layer 110 is formed under a condition to provide a tensile stress of 190 MPa. In the second embodiment, therefore, the ratio of N gas during the formation of the second passivation layer 110 is increased as compared with that of the first embodiment. Therefore, the SiN of the second passivation layer 110 of the second embodiment has a higher N content than that of the first embodiment. Further, the SiN of the second passivation layer 110 has a higher N content than that of the first passivation layer 109 and the third passivation layer 301.

The third passivation layer 301 is formed under a condition to increase the moisture resistance of the above-described SiN layer. The resultant layer exhibits a compressive stress of 140 MPa. After the third passivation layer 301 is formed, the bottom electrode 104 is etched for element isolation by using the third passivation layer 301 as the mask. Thereafter, the interlayer insulator 112 is formed. Further, the interlayer insulator 112 is removed with planarization by CMP till the exposure of the hard mask layer 111. Subsequently, the top electrode 113 is so formed as to be electrically connected to the upper end of the hard mask layer 111.

The total stress of the first passivation layer 109, the second passivation layer 110 and the third passivation layer 301 can be made to approach zero by forming the first passivation layer 109, the second passivation layer 110 and the third passivation layer 301 by plasma CVD in this manner. Accordingly, the passivation layer adapted to suppress the decrease of the interfacial magnetic anisotropy between the CoFeB layer and the MgO layer and to achieve the excellent moisture resistance can be formed. The above-described stress directions and stress values of the first passivation layer 109, the second passivation layer 110 and the third passivation layer 301 are mere examples for explaining that the adjustment is made to make the total stress approach zero and the passivation layers can take values other than the above.

Figure 4A:
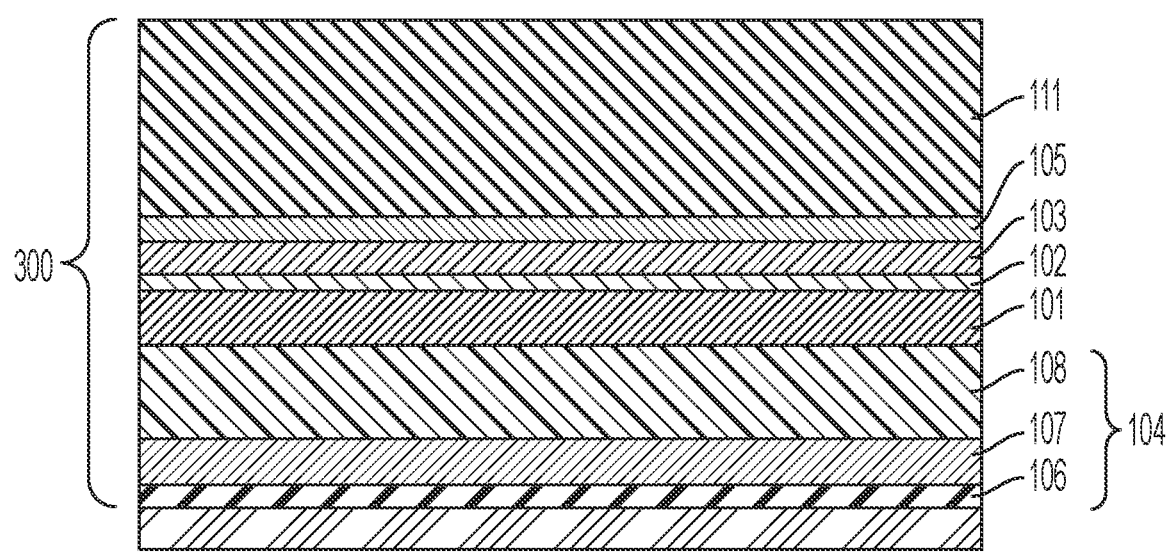
FIG. 4A is a diagram showing a step of a manufacturing process of the perpendicular MTJ element according to the second embodiment hereof.

FIG. 4A to FIG. 4H show a manufacturing flow of the MTJ element of FIG. 3. FIG. 4A shows a layer configuration of the laminate layer constituting the MJT element 300. Similarly to that of the first embodiment, the MTJ element includes the bottom electrode 104 (the first nonmagnetic layer 106, the second nonmagnetic layer 107 and the third nonmagnetic layer 108), the first ferromagnetic layer 101, the first tunnel barrier 102, the second ferromagnetic layer 103, the cap layer 105 and the hard mask layer 111 which are laminated on top of each other in this order. The respective layers have the same thicknesses as those of the first embodiment.

Figure 4B:
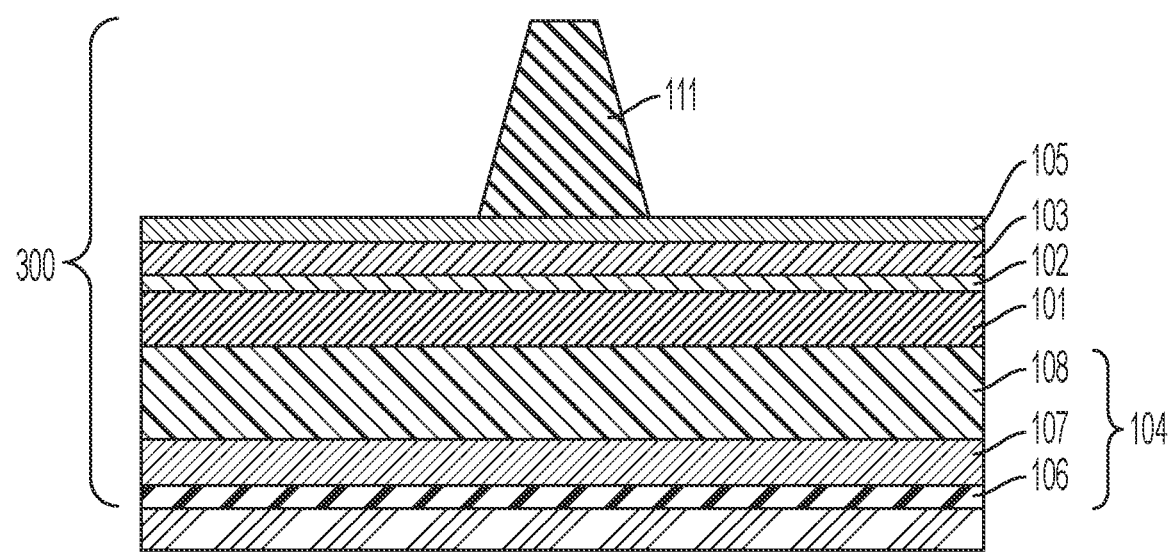
FIG. 4B is a diagram showing a step of the manufacturing process of the perpendicular MTJ element according to the second embodiment hereof.
Figure 4C:
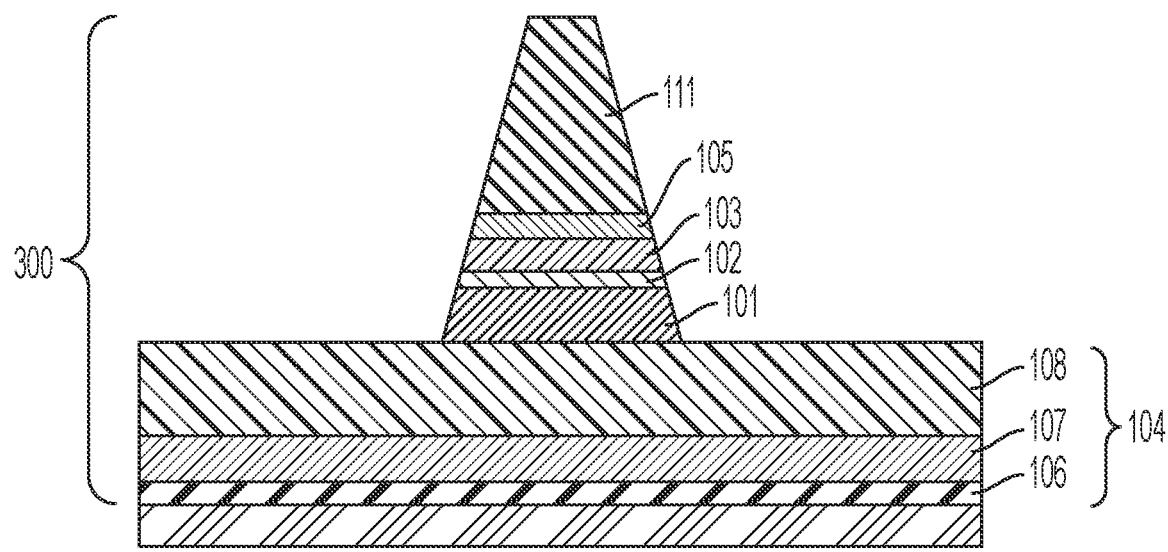
FIG. 4C is a diagram showing a step of the manufacturing process of the perpendicular MTJ element according to the second embodiment hereof.

Steps shown in FIG. 4B and FIG. 4C are also the same as those of the first embodiment. The hard mask layer 111 is processed (FIG. 4B) and then, the first ferromagnetic layer 101, the first tunnel barrier 102, the second ferromagnetic layer 103, and the cap layer 105 are etched (FIG. 4C). The hard mask layer 111 of the second embodiment also employs Ta as the material thereof. The hard mask layer 111 in the layer forming step has a thickness of 150 nm.

Figure 4D:
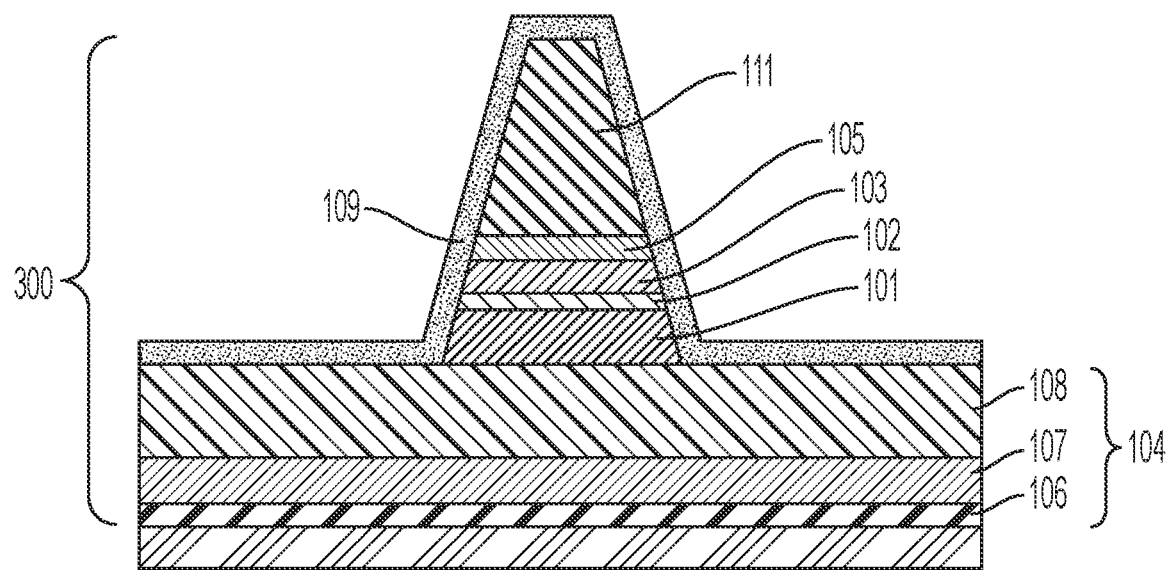
FIG. 4D is a diagram showing a step of the manufacturing process of the perpendicular MTJ element according to the second embodiment hereof.

Subsequently, the first passivation layer 109 is formed by plasma CVD without exposure to the atmosphere. This step is shown in FIG. 4D. This step adopts the condition that the density and energy level of hydrogen ions are lowered so as to suppress the reduction reaction, as described above. The first passivation layer 109 is an SiN layer having a thickness of 10 nm. The first passivation layer 109 exhibits a compressive stress of 50 MPa.

Figure 4E:
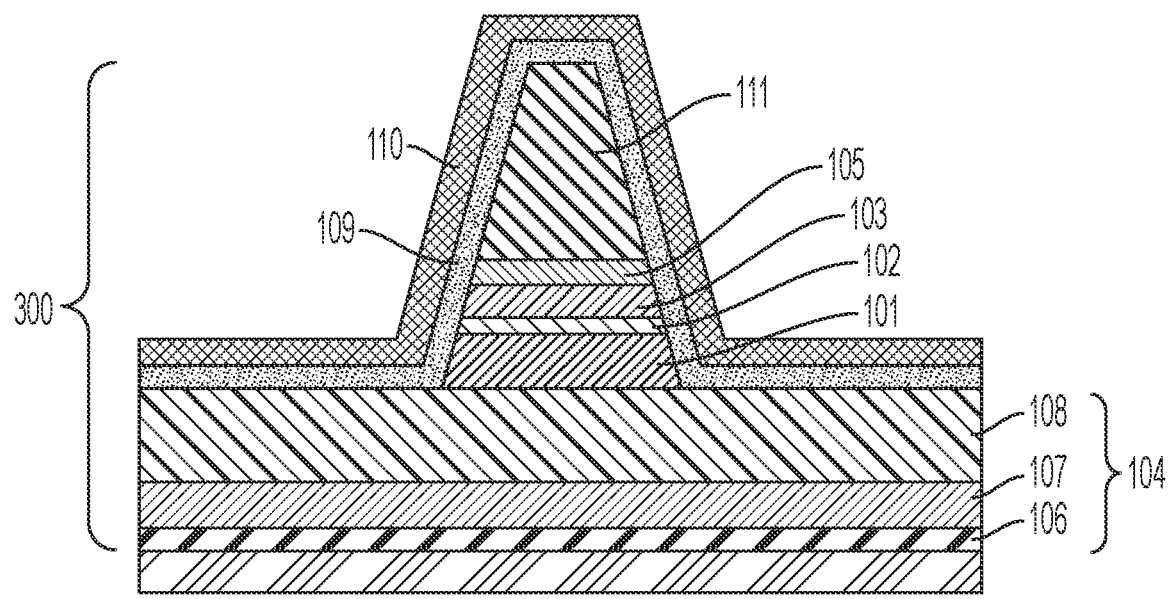
FIG. 4E is a diagram showing a step of the manufacturing process of the perpendicular MTJ element according to the second embodiment hereof.

FIG. 4E shows a step of forming the second passivation layer 110. The second embodiment adopts the SiN layer as the second passivation layer 110, the thickness of which is 10 nm. The first passivation layer 109 is formed at a compressive stress of 50 MPa. Further, the third passivation layer 301 to be described hereinlater exhibits a compressive stress of 140 MPa. Therefore, the second passivation layer 110 is so formed as to exhibit a tensile stress of 190 MPa. The flow rate of N gas during the layer formation by plasma CVD need be increased to achieve the tensile stress of this magnitude. As a result, the N content of the second passivation layer 110 is higher than the N content of the first passivation layer 109 and the third passivation layer 301.

Figure 4F:
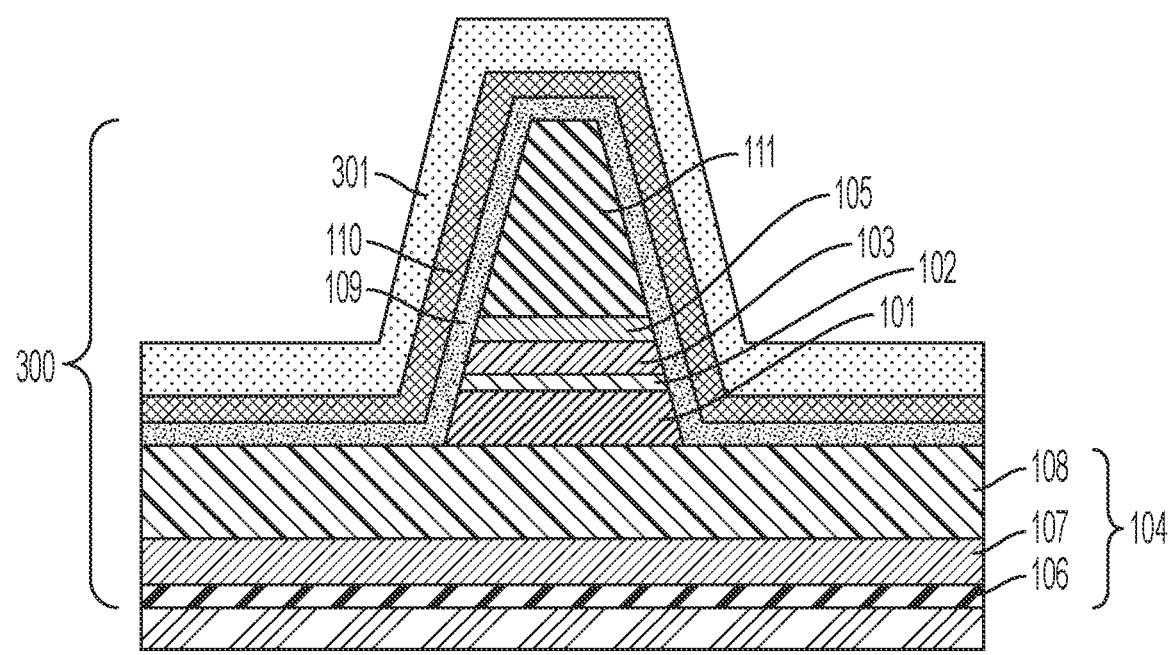
FIG. 4F is a diagram showing a step of the manufacturing process of the perpendicular MTJ element according to the second embodiment hereof.

FIG. 4F shows a step of forming the third passivation layer 301. The third passivation layer 301 is formed under the condition to increase the moisture resistance thereof. As a result, the third passivation layer exhibits a compressive stress of 140 MPa.

Figure 4G:
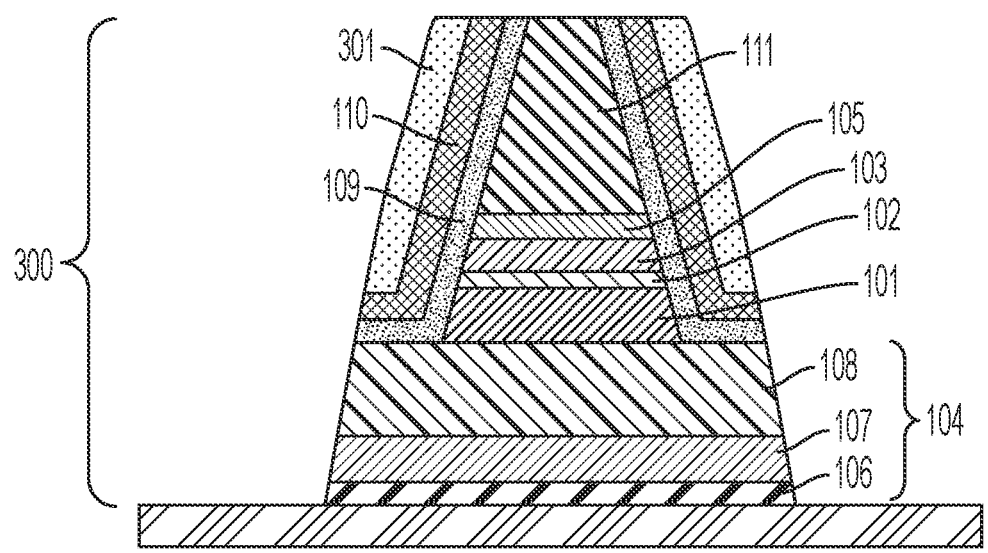
FIG. 4G is a diagram showing a step of the manufacturing process of the perpendicular MTJ element according to the second embodiment hereof.
Figure 4H:
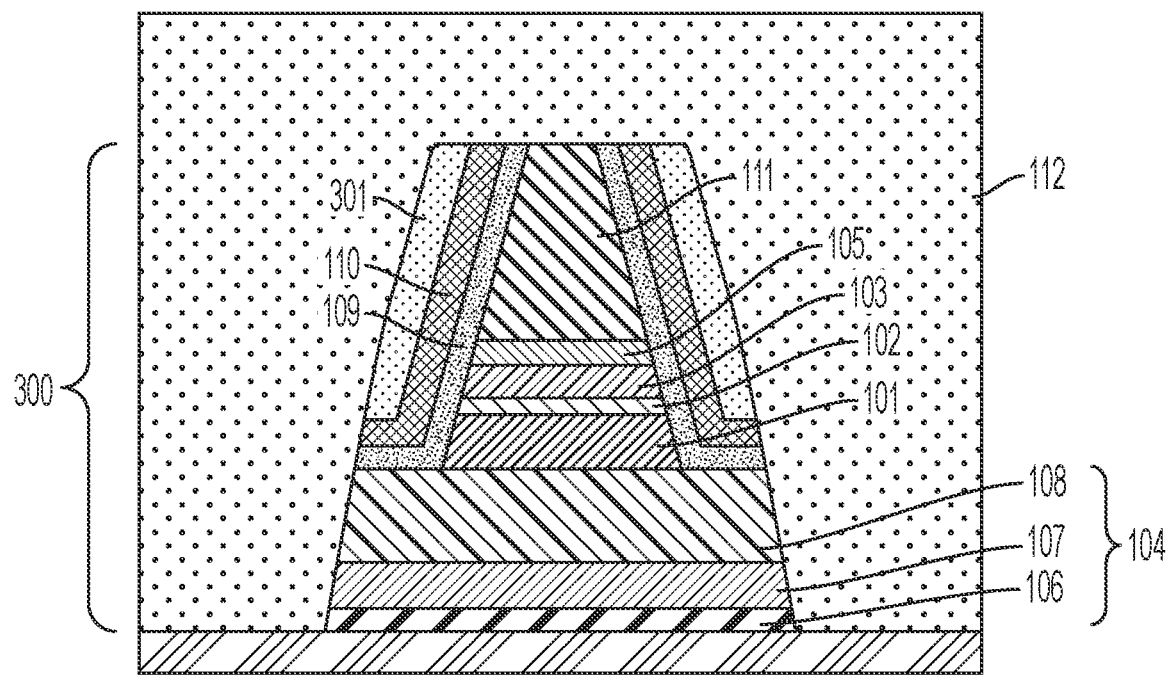
FIG. 4H is a diagram showing a step of the manufacturing process of the perpendicular MTJ element according to the second embodiment hereof.

FIG. 4G shows a step of etching the bottom electrode 104 by using the third passivation layer 301 as the mask. A step of forming the interlayer insulator 112 thereafter is shown in FIG. 4H.

The MTJ element 300 manufactured in this manner is prevented by the first passivation layer 109 from being decreased in the interfacial magnetic anisotropy due to the reduction reaction at the interface between the first ferromagnetic layer 101 and the first tunnel barrier 102, and between the second ferromagnetic layer 103 and the first tunnel barrier 102. Further, the MTJ element is also prevented from being decreased in the interfacial magnetic anisotropy due to the lattice mismatch because the total stress of the first passivation layer 109, the second passivation layer 110 and the third passivation layer 301 is controlled to be in vicinity of zero by the second passivation layer 110. Further, the MTJ element is enhanced in the moisture resistance by the third passivation layer 301. As described above, the MTJ element is adapted to independently impart different functions to the respective passivation layers (e.g., imparting the oxidation-reduction reaction suppression function to the first passivation layer 109, the stress adjustment function to the second passivation layer 110, and a moisture resistance enhancement function to the third passivation layer 301). The individual passivation layers are capable of optimizing the corresponding functions, thus contributing to the enhanced stability of the MTJ element.

Third Embodiment

A structure of an MTJ element according to a third embodiment hereof is described with reference to FIG. 5.

Figure 5:
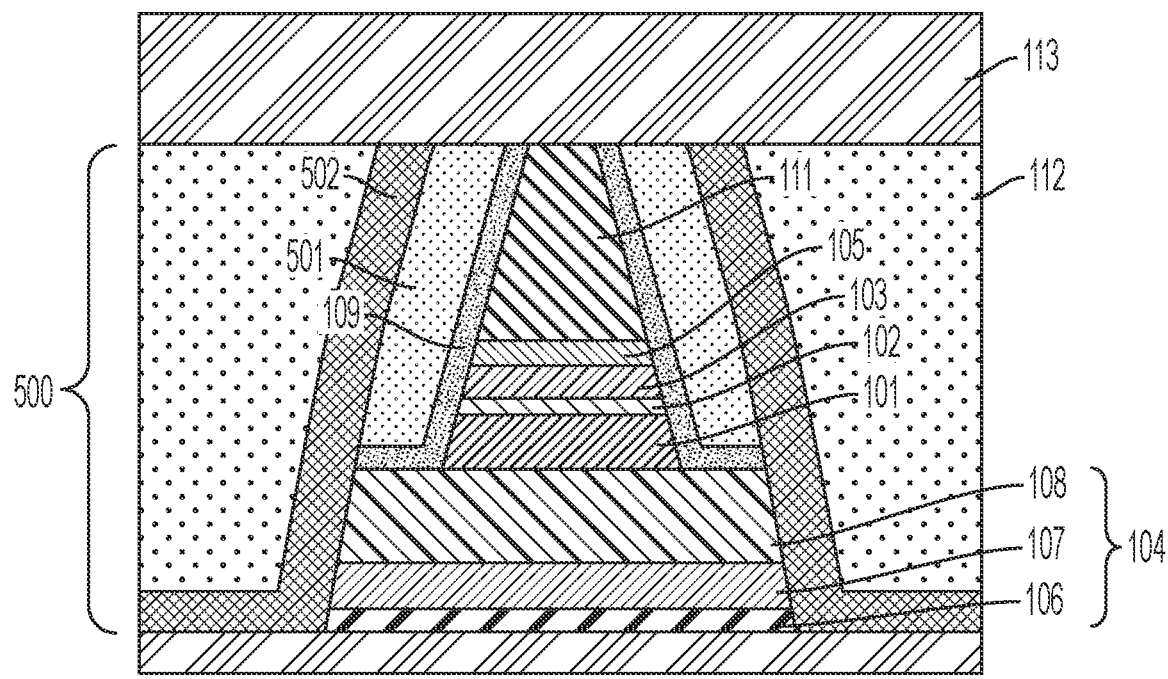
FIG. 5 is a sectional view of a perpendicular MTJ element according to a third embodiment hereof.

FIG. 5 is a sectional view of the MTJ element of the third embodiment. An MTJ element 500 of the third embodiment has the same laminate structure as those of the first embodiment and the second embodiment. While the third embodiment also adopts the bottom pin structure where the first ferromagnetic layer 101 defines the reference layer, and the second ferromagnetic layer 103 defines the recording layer, the embodiment may also adopt the top pin structure where the first ferromagnetic layer 101 defines the recording layer, and the second ferromagnetic layer 103 defines the reference layer. The materials of the individual layers are the same as those of the first embodiment and the second embodiment.

As shown in FIG. 5, the MTJ element 500 of the third embodiment includes the first passivation layer 109 so formed as to cover the side wall of the MTJ element 500, and a second passivation layer 501 so formed as to cover the first passivation layer 109.

The first passivation layer 109 of the third embodiment serves the same role as that of the first embodiment and the second embodiment. The first passivation layer 109 is formed under the condition that the plasma has the low density and low energy so that the frequency of the oxidation reaction or the reduction reaction during the passivation layer formation by plasma CVD decreases. Thus, the reduction of the interfacial magnetic anisotropy is suppressed.

In contrast to that of the first embodiment and the second embodiment, the second passivation layer 501 of this embodiment is formed under a condition to provide excellent moisture resistance. The condition to provide the excellent moisture resistance is as explained about the third passivation layer 301 of the second embodiment.

Subsequently, with the first ferromagnetic layer 101, the first tunnel barrier 102 and the second ferromagnetic layer 103 protected by the second passivation layer 501 excellent in moisture resistance, the MTJ element is transferred to an etching equipment where the bottom electrode 104 is etched for element isolation by using the second passivation layer 501 as the mask. After the bottom electrode 104 has been etched, the MTJ element is transferred to a plasma CVD system where a third passivation layer 502 is formed. The third passivation layer 502 serves a role of stress adjustment, making adjustment such that the total stress of the first passivation layer 109, the second passivation layer 501 and the third passivation layer 502 approaches zero. According to the third embodiment, the first passivation layer 109 exhibits a compressive stress of 50 MPa and the second passivation layer 501 exhibits a compressive stress of 140 MPa. Hence, the third passivation layer 502 is so adjusted as to exhibit a tensile stress of 190 MPa.

According to the third embodiment, as just described, a ratio of the N gas during the formation of the third passivation layer 502 is increased so that the N content of the SiN forming the third passivation layer 502 is higher than that of the first passivation layer 109 and the second passivation layer 501. The stress directions and stress values of the first passivation layer 109, the second passivation layer 501 and the third passivation layer 502 are mere examples for explaining that the adjustment is made to make the total stress approach zero. Hence, the passivation layers can take values other than the above.

The interlayer insulator 112 is formed after the formation of the third passivation layer 502. Further, the interlayer insulator 112 is removed with planarization by CMP till the exposure of the hard mask layer 111. Subsequently, the top electrode 113 is so formed as to be electrically connected to the upper end of the hard mask layer 111.

As just described, the total stress of the first passivation layer 109, the second passivation layer 501 and the third passivation layer 502 can be made to approach zero by forming the respective SiN layers of the first passivation layer 109, the second passivation layer 501 and the third passivation layer 502 as changing the plasma CVD condition at each process. As a result, the passivation layers adapted to suppress the reduction of the interfacial anisotropy at the interface between the CoFeB layer and the MgO layer and to achieve the excellent moisture resistance can be formed.

The third embodiment is characterized in that the third passivation layer disposed on the outermost side of the three passivation layers is responsible for the stress adjustment. The total stress of the first passivation layer 109, the second passivation layer 501 and the third passivation layer 502 plus the interlayer insulator 112 can be more easily made to approach zero by imparting the role of stress adjustment to the third passivation layer 502 as the outermost layer. This is because the third passivation layer 502 serving the role of stress adjustment is disposed near the interlayer insulator 112.

Figure 6A:
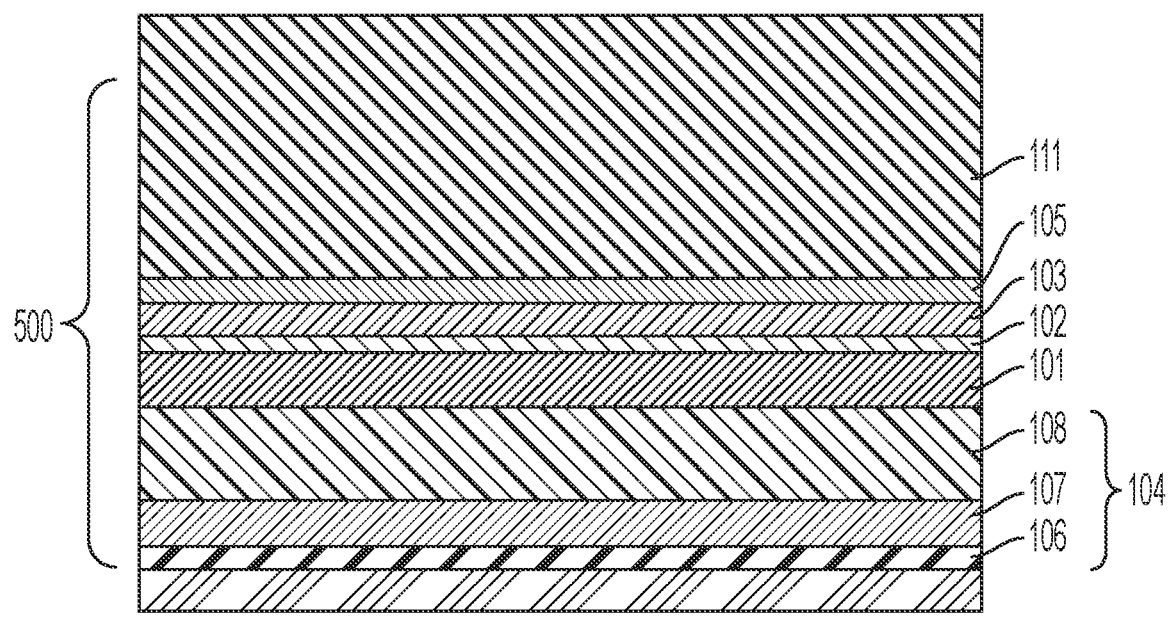
FIG. 6A is a diagram showing a step of a manufacturing process of the perpendicular MTJ element according to the third embodiment hereof.

FIG. 6A to FIG. 6H show a manufacturing flow of the MTJ element of FIG. 5. FIG. 6A shows a layer configuration of the laminate layer constituting the MJT element 500. Similarly to that of the first embodiment and the second embodiment, the MTJ element includes the bottom electrode 104 (the first nonmagnetic layer 106, the second nonmagnetic layer 107 and third nonmagnetic layer 108), the first ferromagnetic layer 101, the first tunnel barrier 102, the second ferromagnetic layer 103, the cap layer 105 and the hard mask layer 111 which are laminated on top of each other in this order. The respective layers have the same thicknesses as those of the first embodiment and the second embodiment.

Figure 6B:
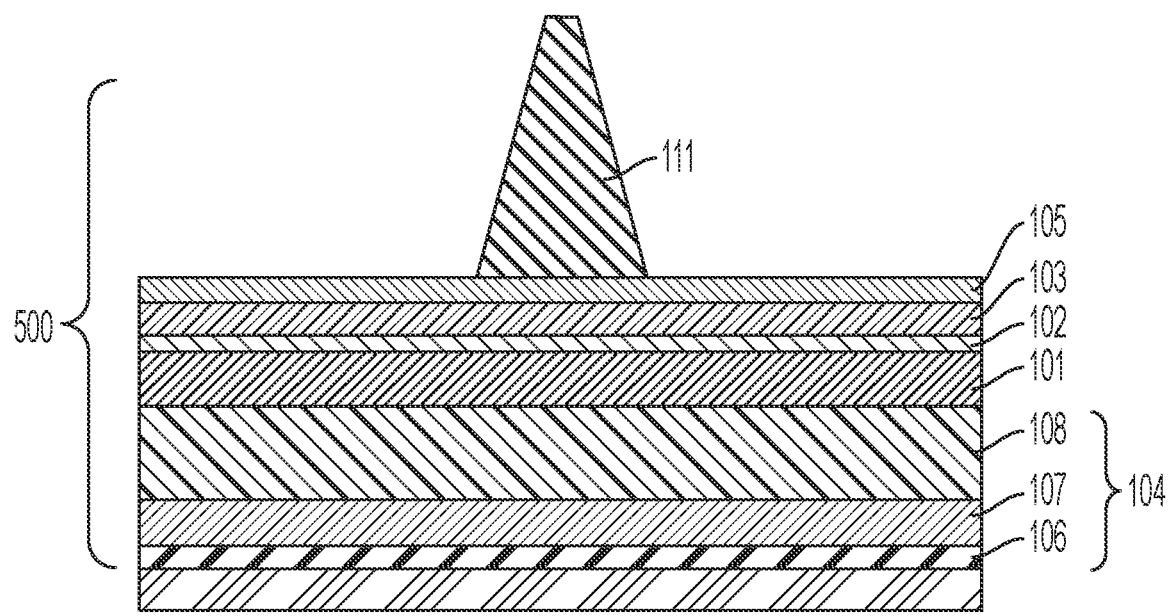
FIG. 6B is a diagram showing a step of the manufacturing process of the perpendicular MTJ element according to the third embodiment hereof.
Figure 6C:
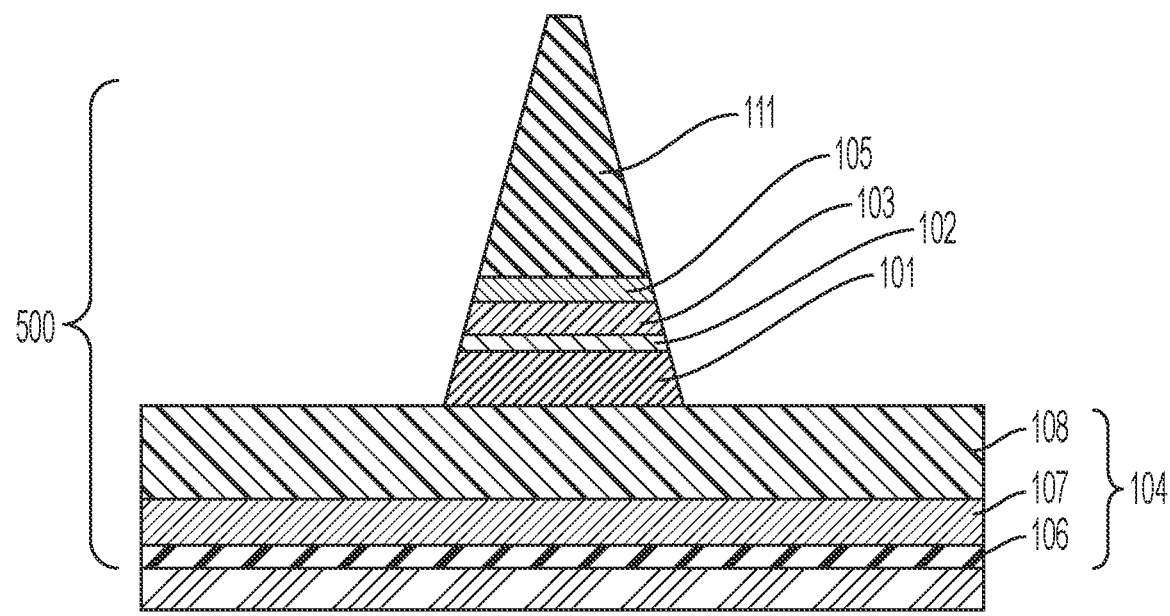
FIG. 6C is a diagram showing a step of the manufacturing process of the perpendicular MTJ element according to the third embodiment hereof.

The steps shown in FIG. 6B and FIG. 6C are also the same as those of the first embodiment and the second embodiment. The hard mask layer 111 is processed (FIG. 6B) and thereafter, the first ferromagnetic layer 101, the first tunnel barrier 102, the second ferromagnetic layer 103, the cap layer 105 are etched (FIG. 6C). The hard mask layer 111 of the third embodiment also employs Ta as the material thereof. The hard mask layer 111 in the layer forming step has a thickness of 150 nm.

Figure 6D:
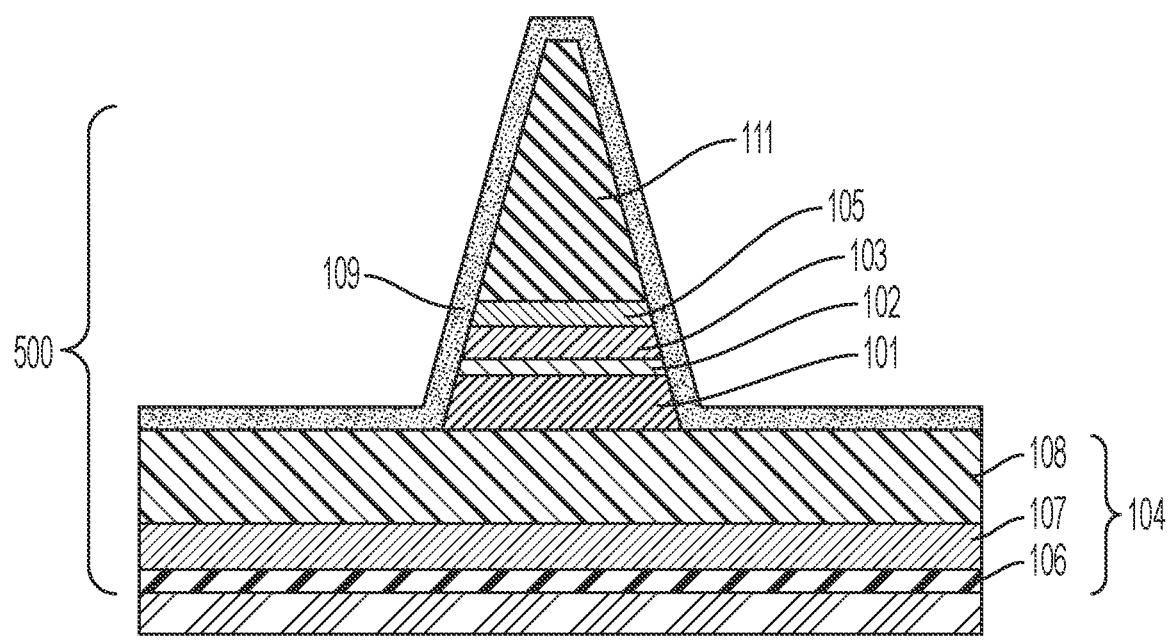
FIG. 6D is a diagram showing a step of the manufacturing process of the perpendicular MTJ element according to the third embodiment hereof.

Subsequently, the first passivation layer 109 is formed by plasma CVD without exposure to the atmosphere. This step is shown in FIG. 6D. Just as in the first and second embodiments, this step adopts the condition that the density and energy level of hydrogen ions are lowered so as to suppress the reduction reaction caused by plasma. The first passivation layer 109 is an SiN layer having a thickness of 10 nm. The first passivation layer 109 exhibits a compressive stress of 50 MPa.

Figure 6E:
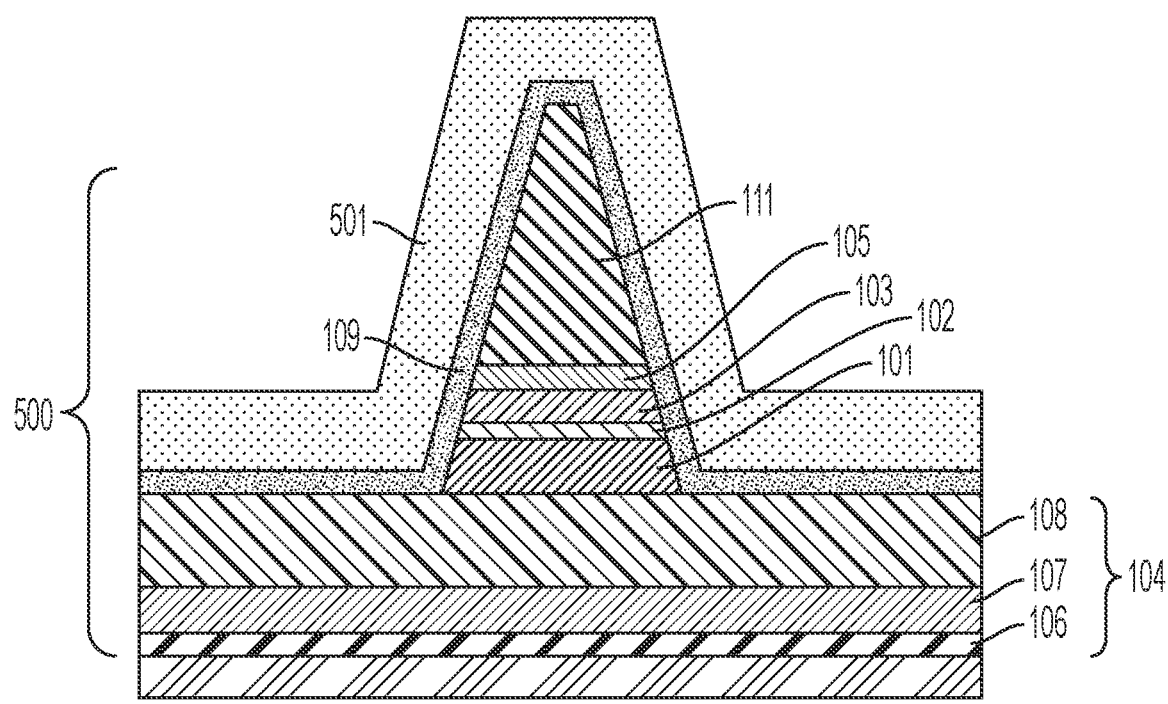
FIG. 6E is a diagram showing a step of the manufacturing process of the perpendicular MTJ element according to the third embodiment hereof.

FIG. 6E shows a step of forming the second passivation layer 501. The third embodiment adopts the SiN layer as the second passivation layer 501, the thickness of which is 20 nm. The second passivation layer is formed under the condition to enhance the moisture resistance of the passivation layer. The resultant layer exhibits a compressive stress of 140 MPa.

Figure 6F:
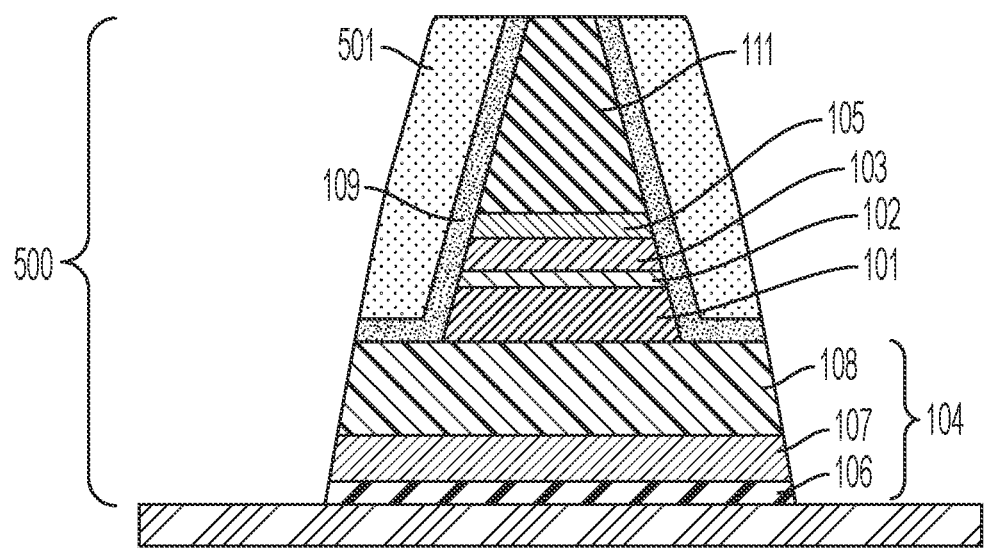
FIG. 6F is a diagram showing a step of the manufacturing process of the perpendicular MTJ element according to the third embodiment hereof.

FIG. 6F shows a step of etching the bottom electrode 104 by using the second passivation layer 501 as the mask.

Figure 6G:
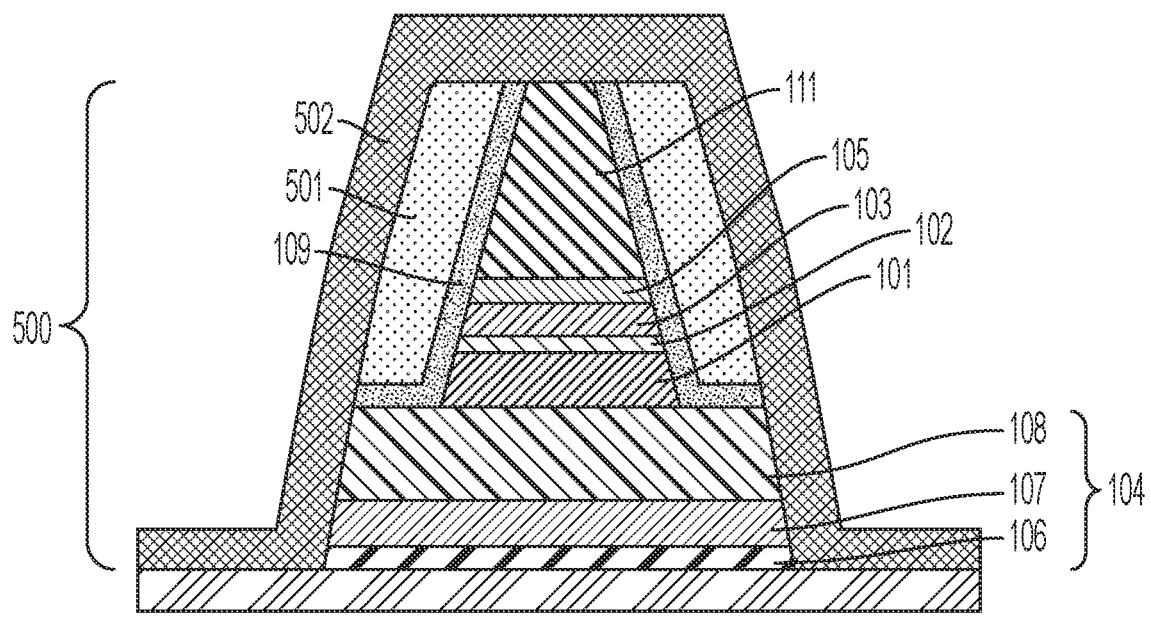
FIG. 6G is a diagram showing a step of the manufacturing process of the perpendicular MTJ element according to the third embodiment hereof.

FIG. 6G shows a step of forming the third passivation layer 502. The third passivation layer 502 is a stress adjusting layer. Since the first passivation layer 501 exhibits the compressive stress of 50 MPa and the second passivation layer 501 exhibits the compressive stress of 140 MPa, the third passivation layer 502 is so formed as to exhibit a tensile stress of 190 MPa. The flow rate of N gas during the layer formation by plasma CVD need be increased to achieve this tensile stress. As a result, the N content of the third passivation layer 502 is higher than the N content of the first passivation layer 109 and the second passivation layer 501.

Figure 6H:
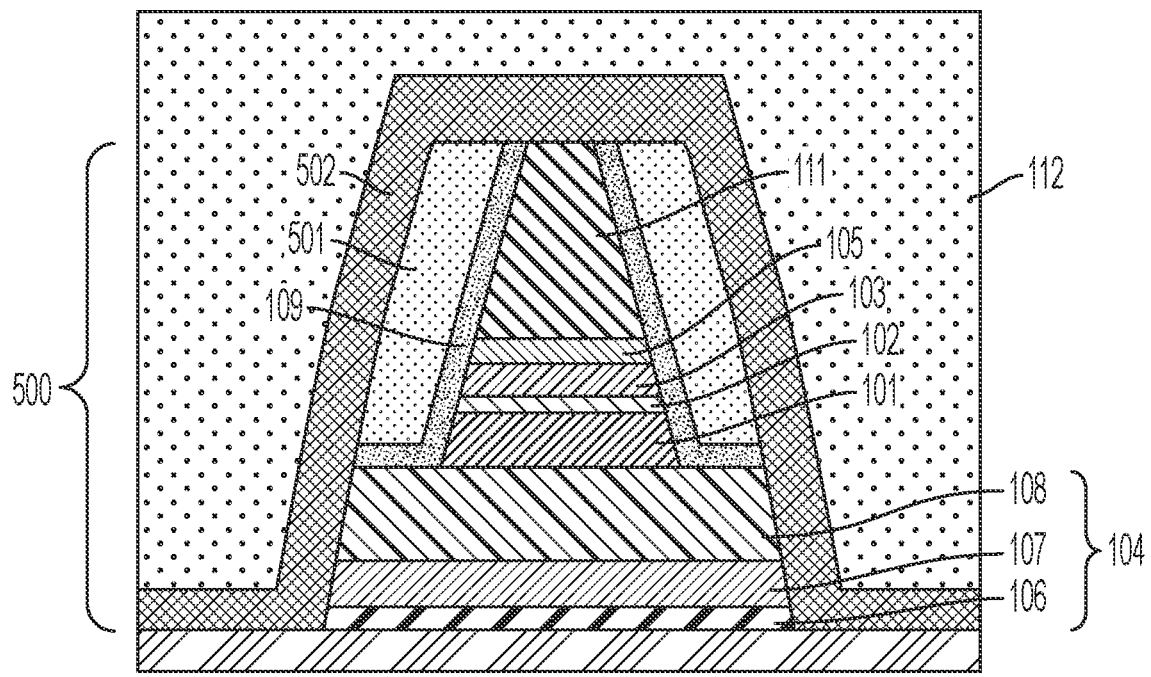
FIG. 6H is a diagram showing a step of the manufacturing process of the perpendicular MTJ element according to the third embodiment hereof.

The subsequent step of forming the interlayer insulator 112 is shown in FIG. 6H.

The MTJ element 500 manufactured in this manner is prevented by the first passivation layer 109 from being decreased in the interfacial magnetic anisotropy due to the reduction reaction at the interface between the first ferromagnetic layer 101 and the first tunnel barrier 102, and between the second ferromagnetic layer 103 and the first tunnel barrier 102. Further, the MTJ element is also improved in the moisture resistance by the second passivation layer 501. Further, the MTJ element is also prevented from being decreased in the interfacial magnetic anisotropy due to the lattice mismatch because the total stress of the first passivation layer 109, the second passivation layer 501 and the third passivation layer 502 is controlled to be in vicinity of zero by the third passivation layer 502. As described above, the MJT element is adapted to independently impart the different functions to the respective passivation layers (e.g., imparting the oxidation-reduction reaction suppression function to the first passivation layer 109, the moisture resistance enhancement function to the second passivation layer 501, and the stress adjustment function to the third passivation layer 502). The individual passivation layers are capable of optimizing the corresponding functions, thus contributing to the enhanced stability of the MTJ element.

The following description is made on common modifications to the MTJ elements described as the first to third embodiments hereof. While the first to the third embodiments provide the example where the recording layer consists of a single layer (the second ferromagnetic layer 103), a recoding layer of a three-layer structure is also applicable for the purpose of further improving the magnetic anisotropy and stabilizing the perpendicular magnetization with respect to the layer plane.

Figure 7:
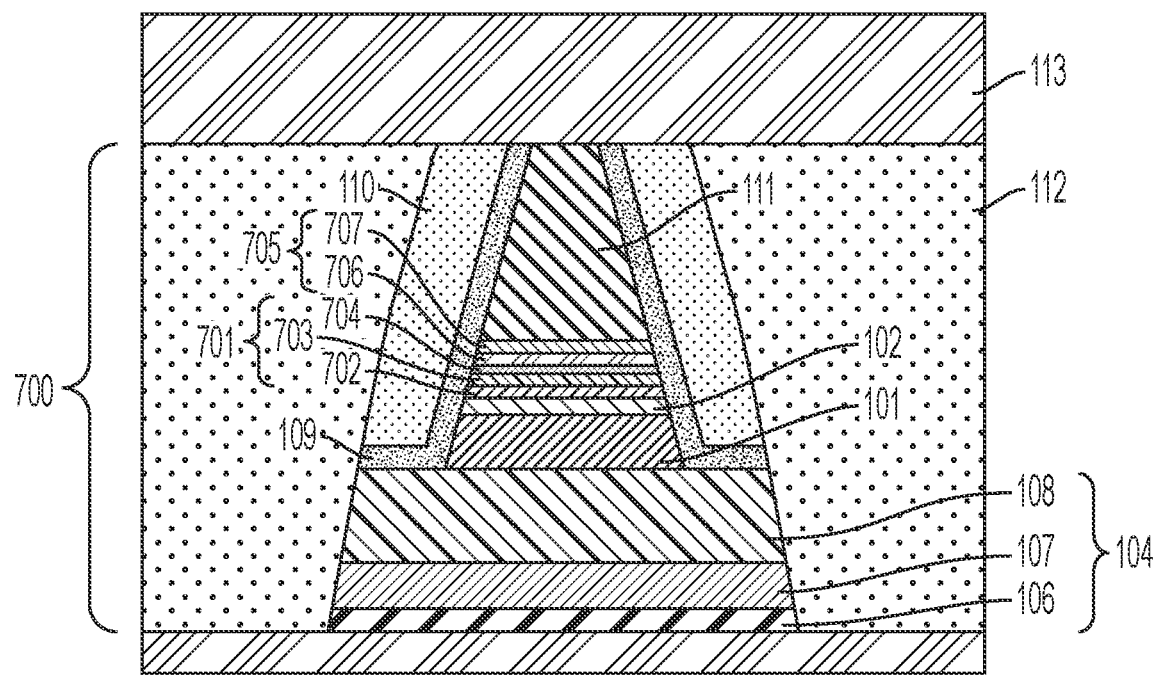
FIG. 7 is a sectional view of a perpendicular MTJ element to which a recording layer of a three-layer structure is applied.

FIG. 7 shows an MTJ element 700 where the magnetic tunnel junction layer of the first embodiment employs a three-layered recording layer 701 in place of the single-layered recording layer (the second ferromagnetic layer 103). The three-layered recording layer 701 includes a third ferromagnetic layer 702, a fourth nonmagnetic layer 703 and a fourth ferromagnetic layer 704. The third ferromagnetic layer 702 employs CoFeB as the material thereof. The fourth nonmagnetic layer 703 employs Ta as the material thereof. The fourth ferromagnetic layer 704 employs CoFeB as the material thereof. In the case where the three-layered recording layer is applied, a cap layer 705 may desirably include a second tunnel barrier 706 and a fifth nonmagnetic layer 707, rather than consisting of a single layer. The second tunnel barrier 706 employs MgO as a material thereof, while the fifth nonmagnetic layer 707 employs Ru as a material thereof.

The combined use of the three-layered recording layer and the two-layered cap layer make the third ferromagnetic layer 702 and the fourth ferromagnetic layer 704 ferromagnetically coupled together via the fourth nonmagnetic layer 703 and act as a single magnetic body. Further, the interfacial magnetic anisotropy also develops in the interface between the fourth ferromagnetic layer 704 and the second tunnel barrier 706. This leads to an increased magnetic anisotropy of the recording layer of the MTJ element. This structure is applicable not only to the MTJ element structure of the first embodiment but also to those of the other embodiments.

Another modification is described. While the foregoing embodiments provide the example where the reference layer consists of a single layer (the first ferromagnetic layer 101), the reference layer may have a synthetic ferrimagnetic structure which employs a magnetic multilayer having perpendicular magnetization for the purpose of further enhancing the magnetic anisotropy and stabilizing the perpendicular magnetization with respect to the layer plane.

Figure 8:
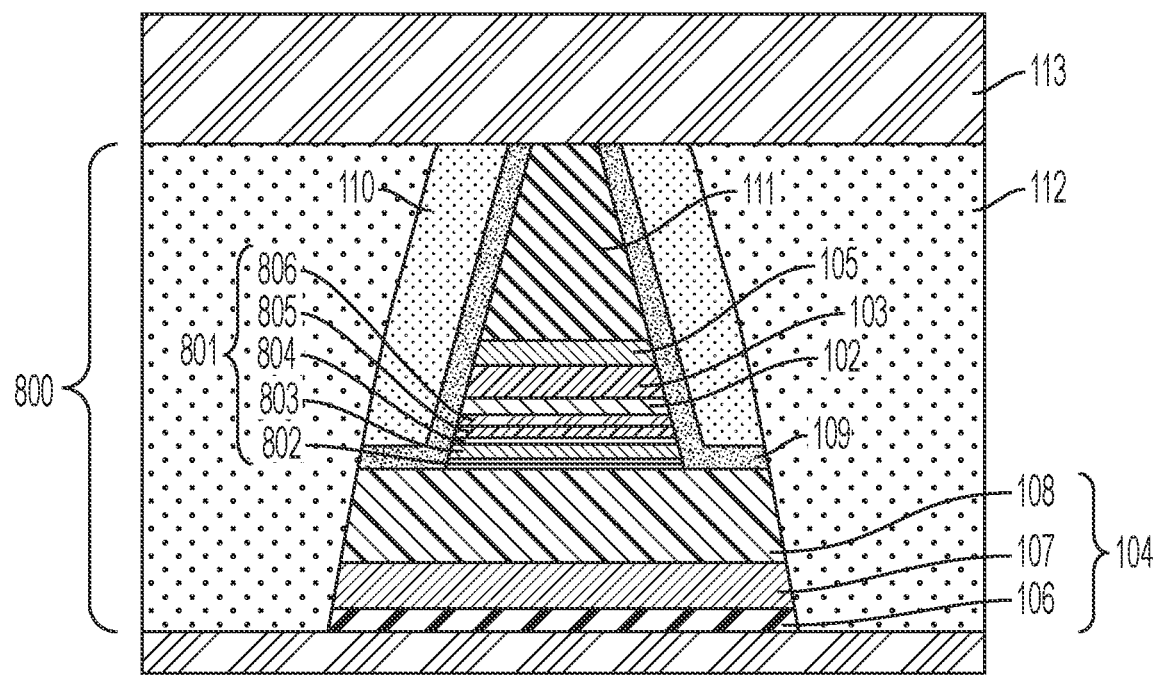
FIG. 8 is a sectional view of a perpendicular MTJ element to which a synthetic ferrimagnetic reference layer is applied.

FIG. 8 shows an MTJ element 800 where the magnetic tunnel junction layer of the first embodiment employs a synthetic ferrimagnetic reference layer 801 having a magnetic multilayer in place of the reference layer consisting of a single layer (the first ferromagnetic layer 101). The synthetic ferrimagnetic reference layer 801 employing the magnetic multilayer includes a first magnetic multilayer 802, a sixth nonmagnetic layer 803, a second magnetic multilayer 804, a seventh nonmagnetic layer 805, and a fifth ferromagnetic layer 806 which are laminated on top of each other in this order. The first magnetic multilayer 802 employs a Co/Pt multilayer as a material thereof. The sixth nonmagnetic layer 803 employs Ru as a material thereof. The second magnetic multilayer 804 employs a Co/Pt multilayer as a material thereof. The seventh nonmagnetic layer 805 employs Ta as a material thereof. The fifth ferromagnetic layer 806 employs CoFeB as a material thereof.

In the synthetic ferrimagnetic reference layer 801 employing the magnetic multilayer, the material and thickness of the sixth nonmagnetic layer 803 are selected such that the magnetization of the first magnetic multilayer 802 and the magnetization of the second magnetic multilayer 804 are antiparallel coupled. Further, the material and thickness of the seventh nonmagnetic layer 805 are selected such that the magnetization of the second magnetic multilayer 804 and the magnetization of the fifth ferromagnetic layer 806 are parallel coupled. The advantages of this structure are as follows. The perpendicular magnetization with respect to the layer plane is stabilized because the first magnetic multilayer 802 and the second magnetic multilayer 804 have intensive perpendicular magnetic anisotropy. Stray magnetic field is decreased because the first magnetic multilayer 802 and the second magnetic multilayer 804 have the synthetic ferrimagnetic structure. A material having a large TMR ratio can be selected for the fifth ferromagnetic layer 806. This structure is applicable not only to the first embodiment but also to the MTJ element structures of the other embodiments. Further, this structure is also applicable in combination with the modification of the recording layer having the three-layer structure.

Figure 9:
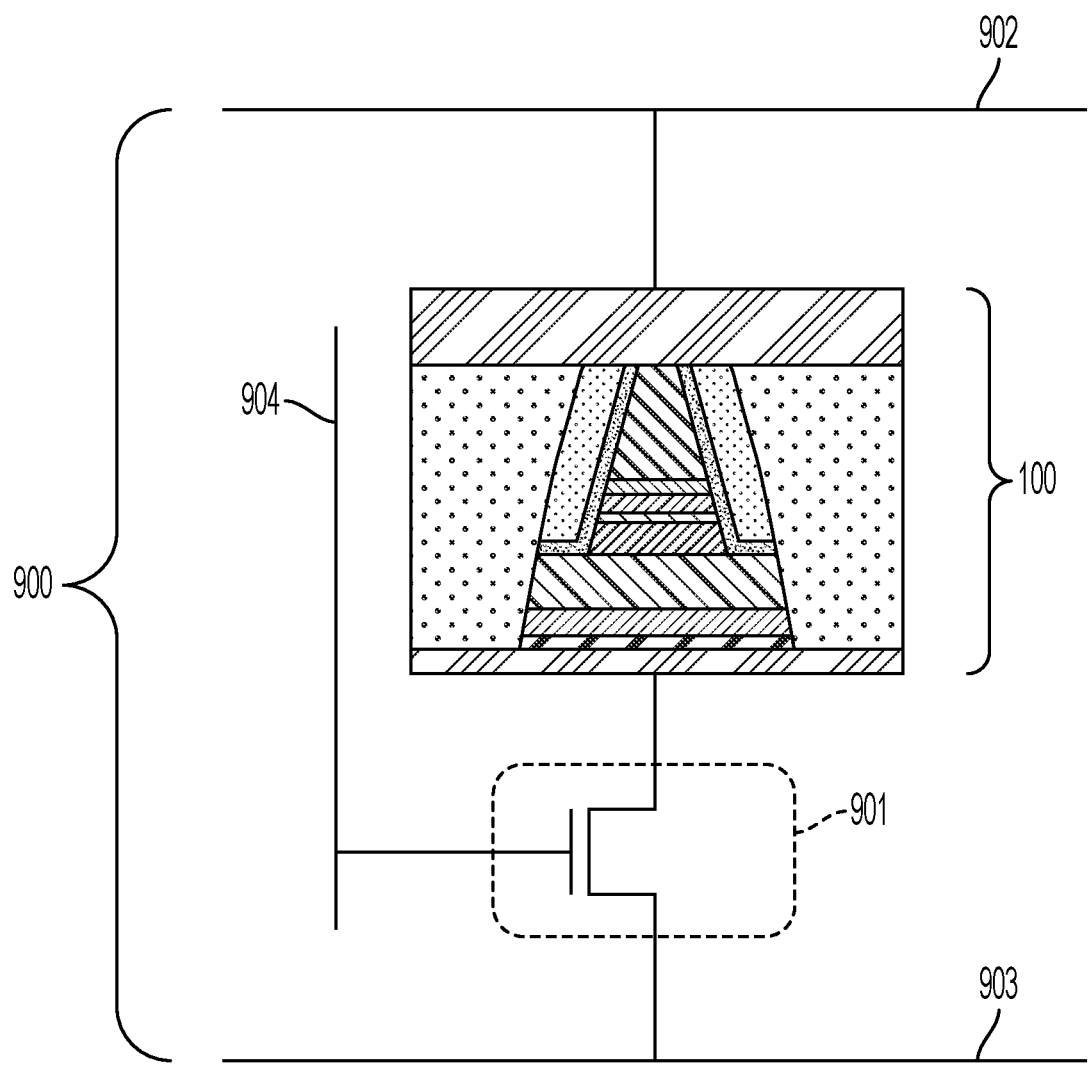
FIG. 9 is a schematic diagram of an MRAM cell.

The above-described MTJ elements are put to use in a memory cell. The memory cell includes the MTJ element and a select transistor. FIG. 9 is a schematic diagram showing a general structure of a memory cell 900. This memory cell employs the MTJ element 100 of the first embodiment as an example. The MTJ element 100 of the memory cell 900 has the bottom electrode 104 electrically connected to a drain electrode of a select transistor 901. Further, the top electrode 113 is electrically connected to a bit line 902. A source electrode of the select transistor 901 is electrically connected to a source line 903 laid in parallel to the bit line 902. A gate electrode of the select transistor 901 is connected to a word line 904 arranged orthogonal to the bit line and the source line.

Figure 10:
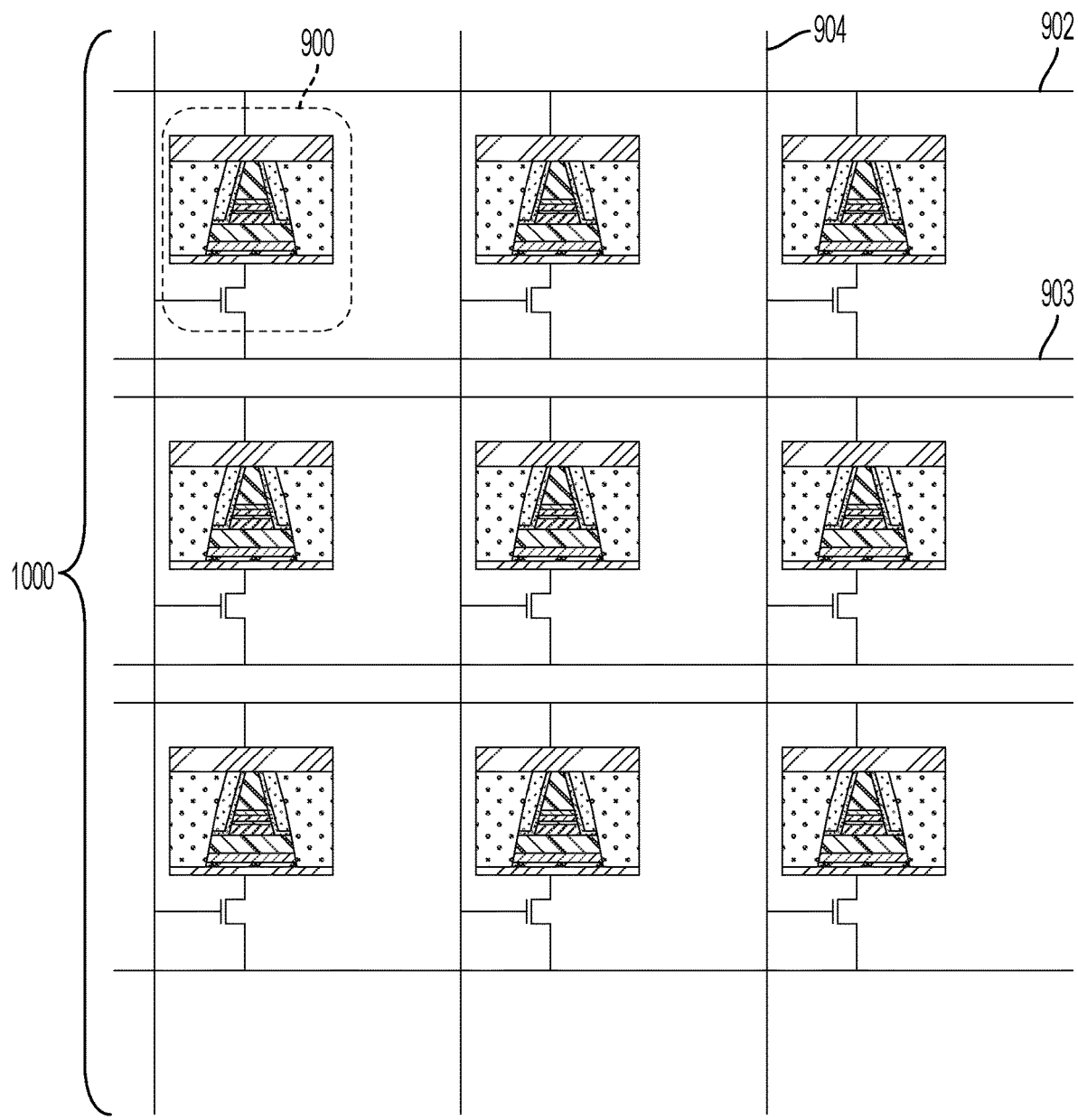
FIG. 10 is a schematic diagram of an MRAM array.

FIG. 10 is a schematic diagram showing an MRAM memory array 1000 where the MTJ elements are arranged in an array. A plurality of bit lines 902, source lines 903 and word lines 904 are arranged while the memory cells 900 are disposed at respective areas of intersection of the word lines 904 with the bit lines 902 and the source lines 903. Each of the bit lines 902, the source lines 903 and the word lines 904 is independently provided with a voltage control mechanism.

To elect a particular memory cell 900, a select transistor 901 is energized by controlling the voltage of the bit line 902 and the source line 903 to which the particular memory cell 900 is electrically connected and applying a voltage to the word line 904 to which the particular memory cell 900 is connected. In a case where the MTJ element is programmed at a low resistance state, for example, the potential of the bit line 902 is set to a higher level than that of the source line 903. When a voltage is applied to the word line 904 in this state, the current flows from the top electrode 113 of the MTJ element to the bottom electrode 104 thereof. When the current exceeds a write threshold current for the MTJ element, the MTJ element is placed in the low resistance state.

What is claimed is:

1. A magnetic tunnel junction element comprising:
   a magnetic tunnel junction layer; and
   a plurality of passivation layers formed on a side wall of the magnetic tunnel junction layer,
   wherein said plurality of passivation layers comprises a first passivation layer which is a first SiN layer formed under a first plasma CVD layer forming condition, and a second passivation layer which is a second SiN layer formed under a second plasma CVD layer forming condition which is different from said first CVD layer forming condition, said first passivation being formed in direct contact with the magnetic tunnel junction layer,
   wherein a hydrogen ion density or hydrogen ion energy of the first plasma CVD layer forming condition for the first passivation layer is lower than a hydrogen ion density or hydrogen ion energy of the second plasma CVD layer forming condition for the second passivation layer, and
   wherein the second passivation layer has a nitrogen density which is higher than a nitrogen density of the first passivation layer.

2. The magnetic tunnel junction element according to claim 1, wherein the second passivation layer covers the first passivation layer.

3. The magnetic tunnel junction element according to claim 2, wherein the first passivation layer exhibits compressive stress, while the second passivation layer exhibits tensile stress.

4. The magnetic tunnel junction element according to claim 2,
   wherein the plurality of passivation layers further comprises a third passivation layer which covers the second passivation layer,
   wherein a nitrogen density of the second passivation layer is higher than a nitrogen density of the first passivation layer and a nitrogen density of the third passivation layer, and
   wherein a moisture resistance of the third passivation layer is higher than a moisture resistance of the first passivation layer and a moisture resistance of the second passivation layer.

5. The magnetic tunnel junction element according to claim 4, wherein the first passivation layer and the third passivation layer exhibit compressive stress while the second passivation layer exhibits tensile stress.

6. The magnetic tunnel junction element according to claim 1,
wherein the second passivation layer which covers the first passivation layer,
wherein the plurality of passivation layers further comprises a third passivation layer which covers the second passivation layer,
wherein a nitrogen density of the third passivation layer is higher than a nitrogen density of the first passivation layer and a nitrogen density of the second passivation layer, and
wherein a moisture resistance of the second passivation layer is higher than a moisture resistance of the first passivation layer and a moisture resistance of the third passivation layer.

7. The magnetic tunnel junction element according to claim 6, wherein the first passivation layer and the second passivation layer each exhibit compressive stress while the third passivation layer exhibits tensile stress.

8. The magnetic tunnel junction element according to claim 1, wherein the magnetic tunnel junction layer includes a first ferromagnetic layer defining a recording layer, a second ferromagnetic layer defining a reference layer and a first tunnel barrier between the recording layer and the reference layer.

9. The magnetic tunnel junction element according to claim 1, further comprising:
a cap layer in contact with the magnetic tunnel junction layer, and
a bottom electrode in contact with the magnetic tunnel junction layer,
wherein the magnetic tunnel junction layer includes: a recording layer in contact with the cap layer; a reference layer in contact with the bottom electrode; and a first tunnel barrier between the recording layer and the reference layer,
the bottom electrode includes: a first nonmagnetic layer, a second nonmagnetic layer and a third nonmagnetic layer which are laminated on top of each other,
the recording layer includes: a third ferromagnetic layer in contact with the first tunnel barrier; a fourth ferromagnetic layer; and a fourth nonmagnetic layer between the third ferromagnetic layer and the fourth ferromagnetic layer, and
the cap layer includes: a second tunnel barrier in contact with the fourth ferromagnetic layer; and a fifth nonmagnetic layer.

10. The magnetic tunnel junction element according to claim 1, further comprising:
a cap layer in contact with the magnetic tunnel junction layer, and
a bottom electrode in contact with the magnetic tunnel junction layer,
wherein the magnetic tunnel junction layer includes: a recording layer in contact with the cap layer; a reference layer in contact with the bottom electrode; and a first tunnel barrier between the recording layer and the reference layer,
the reference layer includes a first magnetic multilayer, a sixth nonmagnetic layer, a second magnetic multilayer, a seventh nonmagnetic layer and a fifth ferromagnetic layer which are laminated on top of each other in this order,
the first magnetic multilayer is in contact with the bottom electrode,
the fifth ferromagnetic layer is in contact with the first tunnel barrier, and
the magnetization of the first magnetic multilayer and the magnetization of the second magnetic multilayer are antiparallel coupled while the magnetization of the second magnetic multilayer and the magnetization of the fifth ferromagnetic layer are parallel coupled.

11. A magnetic memory comprising:
a plurality of bit lines extended in a first direction;
a plurality of source lines extended in the first direction;
a plurality of word lines extended in a second direction orthogonal to the first direction; and
a plurality of memory cells arranged at intersections of the bit lines and source lines with the word lines and each including a magnetic tunnel junction element and select transistors, source/drain paths of the select transistors being serially connected to the magnetic tunnel junction element,
wherein each said serially connected magnetic tunnel junction element and the source/drain path of the select transistor are connected between the bit line and the source line, and a gate of the select transistor is connected to the word line, and
wherein each said magnetic tunnel junction element comprises
a magnetic tunnel junction layer; and
a plurality of passivation layers formed on a side wall of the magnetic tunnel junction layer,
wherein said plurality of passivation layers comprises a first passivation layer which is a first SiN layer formed under a first plasma CVD layer forming condition, and a second passivation layer which is a second SiN layer formed under a second plasma CVD layer forming condition which is different from said first CVD layer forming condition, said first passivation being formed in direct contact with the magnetic tunnel junction layer,
wherein a hydrogen ion density or hydrogen ion energy of the first plasma CVD layer forming condition for the first passivation layer is lower than a hydrogen ion density or hydrogen ion energy of the second plasma CVD layer forming condition for the second-passivation layer, and
wherein the second passivation layer has a nitrogen density which is higher than a nitrogen density of the first passivation layer.

12. A method of manufacturing a magnetic tunnel junction element from a laminate layer which includes a magnetic tunnel junction layer including a first ferromagnetic layer, a first tunnel barrier and a second ferromagnetic layer that are laminated on top of each other in this order; a cap layer; and a hard mask layer which are laminated on top of each other in this order,
the method comprising:
a first step of etching the cap layer and the magnetic tunnel junction layer using the patterned hard mask layer;
a second step of forming a first SiN layer by plasma CVD on side walls of the hard mask layer, the cap layer and in direct contact with the magnetic tunnel junction layer, and
a third step of forming by plasma CVD a second SiN layer which covers the first SiN layer,
wherein a hydrogen ion density or hydrogen ion energy in the second step is lower than a hydrogen ion density or hydrogen ion energy in the third step, and wherein the second SiN layer is formed in the third step under a layer forming condition that causes a nitrogen density in the second SiN layer to be higher than a nitrogen density in the first SiN layer.

13. The method according to claim 12,
wherein the first SiN layer is formed in the second step under a layer forming condition that causes the first SiN layer to exhibit compressive stress, and
wherein the second SiN layer is formed in the third step under a layer forming condition that causes the second SiN layer to exhibit tensile stress.

14. The method according to claim 12, further comprising:
a fourth step of forming by plasma CVD a third SiN layer which covers the second SiN layer,
wherein the hydrogen ion density or hydrogen ion energy in the second step is lower than a hydrogen ion density or hydrogen ion energy in the fourth step,
wherein the second SiN layer is formed in the third step under a layer forming condition that causes the nitrogen density in the second SiN layer to be higher than a nitrogen density in the third SiN layer, and
wherein the third SiN layer is formed in the fourth step under a layer forming condition that causes a moisture resistance of the third SiN layer to be higher than a moisture resistance of the first SiN layer and a moisture resistance of the second SiN layer.

15. The method according to claim 14,
wherein the third SiN layer is formed in the fourth step under a layer forming condition that causes the third SiN layer to exhibit compressive stress.

16. A method of manufacturing a magnetic tunnel junction element from a laminate layer which includes a magnetic tunnel junction layer including a first ferromagnetic layer, a first tunnel barrier and a second ferromagnetic layer that are laminated on top of each other in this order; a cap layer; and a hard mask layer which are laminated on top of each other in this order,
the method comprising:
a first step of etching the cap layer and the magnetic tunnel junction layer using the patterned hard mask layer;
a second step of forming by plasma CVD a first SiN layer on side walls of the hard mask layer, the cap layer and in direct contact with the magnetic tunnel junction layer,
a third step of forming by plasma CVD a second SiN layer which covers the first SiN layer, and
a fourth step of forming by plasma CVD a third SiN layer which covers the second SiN layer,
wherein a hydrogen ion density or hydrogen ion energy in the second step is lower than a hydrogen ion density or hydrogen ion energy in the third step and the fourth step,
wherein the second SiN layer is formed in the third step under a layer forming condition that causes a moisture resistance of the second SiN layer to be higher than a moisture resistance of the first SiN layer and a moisture resistance of the third SiN layer, and
wherein the third SiN layer is formed in the fourth step under a layer forming condition that causes a nitrogen density in the third SiN layer to be higher than a nitrogen density in the first SiN layer and a nitrogen density in the second SiN layer.

17. The method according to claim 16,
wherein the first SiN layer is formed in the second step under a layer forming condition that causes the first SiN layer to exhibit compressive stress,
wherein the second SiN layer is formed in the third step under a layer forming condition that causes the second SiN layer to exhibit compressive stress, and
wherein the third SiN layer is formed in the fourth step under a layer forming condition that causes the third SiN layer to exhibit tensile stress.

* * * * *